(12) United States Patent
Notohara et al.

(10) Patent No.: US 7,339,120 B2
(45) Date of Patent: Mar. 4, 2008

(54) ELECTROMAGNETIC WAVE SHIELD

(75) Inventors: Yasuhiro Notohara, Kasuga (JP);
Shinichirou Kaneko, Fukuoka (JP);
Futoshi Deguchi, Fukuoka (JP);
Hiroshi Yoshinaga, Kasuya-gun (JP);
Shoichi Shimizu, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/875,626

(22) Filed: Jun. 25, 2004

(65) Prior Publication Data
US 2005/0029919 A1    Feb. 10, 2005

(30) Foreign Application Priority Data

| Jun. 26, 2003 | (JP) | ............ P. 2003-182321 |
| Nov. 19, 2003 | (JP) | ............ P. 2003-389129 |
| Jan. 29, 2004 | (JP) | ............ P. 2004-021086 |

(51) Int. Cl.
*H05K 9/00* (2006.01)

(52) U.S. Cl. .................. 174/357; 174/392

(58) Field of Classification Search .......... 174/35 R, 174/35 MS, 35 GC, 357, 392; 361/816, 361/818
See application file for complete search history.

(56) References Cited

U.S. PATENT DOCUMENTS

| 4,701,764 A |   | 10/1987 | Malcombe |
| 4,906,973 A |   | 3/1990 | Karbowski et al. |
| 5,028,490 A | * | 7/1991 | Koskenmaki et al. ....... 428/594 |
| 5,153,378 A | * | 10/1992 | Garvy, Jr. ............... 174/35 R |
| 5,258,766 A |   | 11/1993 | Murdoch |
| 5,360,941 A | * | 11/1994 | Roes ..................... 174/378 |
| 5,367,291 A |   | 11/1994 | Fockens |
| 5,602,556 A |   | 2/1997 | Bowers |
| 5,761,054 A | * | 6/1998 | Kuhn ..................... 361/818 |
| 6,043,792 A |   | 3/2000 | Finlayson |

(Continued)

FOREIGN PATENT DOCUMENTS

JP    01126785    5/1989

(Continued)

OTHER PUBLICATIONS

International Search Report dated Jan. 24, 2005 in U.S. Appl. No. 10/929,449.

(Continued)

*Primary Examiner*—Hung V. Ngo
(74) *Attorney, Agent, or Firm*—Stevens, Davis, Miller & Mosher, LLP

(57) ABSTRACT

It is an object of the invention to provide an electromagnetic wave shield for attenuating a electric far field while suppressing the attenuation of the vicinal magnetic flux of an electromagnetic wave discharged from a high frequency electromagnetic wave generator.

An electromagnetic wave shield according to the invention comprises a plurality of electric conductors, a ground contact for carrying out a connection to a ground, and a lead wire for connecting the electric conductors to the ground contact, the electric conductors being electrically connected to the ground contact through the lead wire, wherein the electric conductors are provided in such a manner that a path reaching the ground contact through the lead wire from an optional point of each of the electric conductors is uniquely determined.

3 Claims, 17 Drawing Sheets

U.S. PATENT DOCUMENTS

| | | | |
|---|---|---|---|
| 6,054,647 A * | 4/2000 | Ridener | 174/35 MS |
| 6,127,928 A | 10/2000 | Issacman et al. | |
| 6,166,637 A | 12/2000 | Cyr et al. | |
| 6,344,824 B1 | 2/2002 | Takasugi et al. | |
| 6,356,243 B1 | 3/2002 | Schneider et al. | |
| 6,703,935 B1 | 3/2004 | Chung et al. | |
| 6,855,883 B1 * | 2/2005 | Matsui | 174/35 MS |
| 2001/0020896 A1 | 9/2001 | Higuchi | |
| 2002/0011189 A1 * | 1/2002 | Leightner et al. | 106/716 |
| 2002/0044096 A1 | 4/2002 | Chung | |
| 2003/0052788 A1 | 3/2003 | Chung | |
| 2004/0100413 A1 | 5/2004 | Waldner | |
| 2005/0179604 A1 | 8/2005 | Liu et al. | |
| 2006/0028384 A1 | 2/2006 | Akiho et al. | |

FOREIGN PATENT DOCUMENTS

| | | |
|---|---|---|
| JP | 2000 163523 | 6/2000 |
| JP | 2001 319192 | 11/2001 |
| JP | 2001 326526 | 11/2001 |
| JP | 2002 007976 | 1/2002 |
| JP | 2002 063552 | 2/2002 |
| JP | 2002 279362 | 9/2002 |
| JP | 2003 258545 | 9/2003 |
| JP | 2004 070804 | 3/2004 |
| JP | 2004 140513 | 5/2004 |
| WO | 8907347 | 8/1989 |
| WO | 03061069 | 7/2003 |

OTHER PUBLICATIONS

Office Action dated May 31, 2006 in U.S. Appl. No. 10/929,449.
International Search Report dated Feb. 11, 2005 in U.S. Appl. No. 10/974,031.
Office Action dated Apr. 11, 2006 in U.S. Appl. No. 10/974,031.
Office Action dated Sep. 26, 2006 in U.S. Appl. No. 10/974, 031.

* cited by examiner

ELECTROMAGNETIC WAVE SHIELD

BACKGROUND OF THE INVENTION

1. Field of the Invention

The present invention relates to an electromagnetic wave shield to be used in an apparatus applying a high frequency electromagnetic field.

2. Description of the Related Art

Equipment applying a high frequency electromagnetic field has been utilized in a variety of fields, for example, a cooking device using induction heating, a fixing component for a laser printer, a discharge lamp using a plasma induced by an induction field or a communicating device for transferring an energy in non-contact which uses an induction field. In an information terminal such as a computer including a cell phone, moreover, the influence of an electromagnetic wave radiated secondarily from the electronic equipment cannot be disregarded due to a rapid increase in a radio information transmission or a further increase in a driving frequency, and the regulation of an unnecessary radiation, that is, the regulation of the discharge of an unnecessary electromagnetic wave has been stricter.

In the equipment applying a high frequency electromagnetic field, an RFID system for carrying out a communication with a non-contact IC, card including an antenna coil in non-contact by utilizing an electromagnetic induction has got into the limelight. In this system, a high frequency magnetic flux is utilized for the communication. When a communicating antenna is to be driven, a high frequency electric field is also discharged in addition to a high frequency magnetic flux. The intensity of the high frequency electric field is regulated by the Radio Law. In order to satisfy the Radio Law, measures have been taken, for example, the output of the antenna has been decreased. In this case, however, there is a problem in that a communication distance is shortened. For other measures, a shield plate is provided around the antenna.

FIG. 13 is a schematic perspective view showing a conventional electromagnetic wave shield. According to (JP-A-2001-326526), for example, there has been disclosed a shield antenna coil 23 including an electric field shield pattern 21 and a feeding pattern coil 22 as shown in FIG. 13. The electric field shield pattern 21 has such a width as to cover the feeding pattern coil 22, and is set to be an open loop in order to prevent the generation of an eddy current to block the radiation of a magnetic flux component and is provided to cover the feeding pattern coil 22, and serves as a ground as shown in the drawing. By such a structure, it is possible to decrease such a magnetic field component as to obstruct the communication of other radio devices while maintaining a necessary magnetic flux component for a communication.

In these conventional structures, however, there is a problem in that the electric field can be decreased and the attenuation of a vicinal magnetic flux required for the communication is also increased, resulting in an extreme reduction in a communication distance.

SUMMARY OF THE INVENTION

The invention solves the problems and has an object to provide an electromagnetic wave shield for attenuating a electric far field while suppressing the attenuation of the vicinal magnetic flux of an electromagnetic waves discharged from a high frequency electromagnetic wave generator.

In order to attain the object, the invention provides an electromagnetic wave shield comprising a plurality of electric conductors, a ground contact for carrying out a connection to a ground, and a lead wire for connecting the electric conductors to the ground contact, the electric conductors being electrically connected to the ground contact through the lead wire, wherein the electric conductors are provided in such a manner that a path reaching the ground contact through the lead wire from an optional point of each of the electric conductors is uniquely determined.

According to the electromagnetic wave shield in accordance with the invention, the magnetic coupling of the magnetic flux of the electromagnetic wave discharged from a high frequency electromagnetic wave generator and the electromagnetic wave shield can be reduced. Therefore, it is possible to provide an electromagnetic wave shield capable of attenuating a electric far field while suppressing the 5 attenuation of a vicinal magnetic flux. By using the electromagnetic wave shield according to the invention, mainly, it is possible to attenuate the electric far field while suppressing the attenuation of the vicinal magnetic flux as countermeasures against the unnecessary radiation of high frequency applying apparatuses such as a high frequency heater, a non-electrode discharge lamp and a communicating device which mainly utilize the vicinal magnetic flux for their operations. Consequently, it is possible to effectively utilize the vicinal magnetic flux generated from a high frequency electromagnetic wave generator.

In order to attain the object, the invention provides an electromagnetic wave shield comprising a plurality of electric conductors, a ground contact for carrying out a connection to a ground, and a lead wire for connecting the electric conductors to the ground contact, the electric conductors being electrically connected to the ground contact through the lead wire and being provided in such a manner that a path reaching the ground contact through the lead wire from an optional point on each of the electric conductors is uniquely determined, wherein a wire width of each of the electric conductors ranges from 0.05 mm to 5 mm, and an average interval between the electric conductors which is obtained by dividing a length of a side on which the electric conductors and an outer periphery of a region provided with the electric conductors cross each other by a number of points on which the electric conductors and the outer periphery of the region provided with the electric conductors cross each other ranges from 4 mm to 50 mm.

According to the electromagnetic wave shield in accordance with the invention, the magnetic coupling of the magnetic field of the electromagnetic wave discharged from a high frequency electromagnetic wave, generator and the electromagnetic wave shield can be reduced. Therefore, it is possible to provide an electromagnetic wave shield capable of attenuating a electric far field while suppressing the attenuation of a magnetic near field. By using the electromagnetic wave shield according to the invention, it is possible to attenuate the electric far field while suppressing the attenuation of the vicinal magnetic flux as countermeasures against the unnecessary radiation of high frequency applying apparatuses such as a high frequency heater, a non-electrode discharge lamp and a communicating device which mainly utilize the magnetic near field for their operations. Consequently, it is possible to effectively utilize the magnetic near field generated from the high frequency electromagnetic wave generator.

In order to attain the object, the invention provides an electromagnetic wave shield comprising a plurality of electric conductors, a ground contact for carrying out a connection to a ground, and a lead wire for connecting the electric conductors to the ground contact, the electric conductors being electrically connected to the ground contact through the lead wire and being provided in such a manner that a path reaching the ground contact through the lead wire from an optional point on each of the electric conductors is uniquely determined, wherein a wire width of each of the electric conductors ranges from 0.05 mm to 5 mm, and an average interval between the electric conductors which is obtained by dividing a length of a side on which the electric conductors and an outer periphery of a region provided with the electric conductors cross each other by a number of points on which the electric conductors and the outer periphery of the region provided with the electric conductors cross each other ranges from 4 mm to 50 mm.

According to the electromagnetic wave shield in accordance with the invention, the magnetic coupling of the magnetic field of the electromagnetic wave discharged from a high frequency electromagnetic wave generator and the electromagnetic wave shield can be reduced. Therefore, it is possible to provide an electromagnetic wave shield capable of attenuating a electric far field while suppressing the attenuation of a magnetic near field. By using the electromagnetic wave shield according to the invention, it is possible to attenuate the electric far field while suppressing the attenuation of the vicinal magnetic flux as countermeasures against the unnecessary radiation of high frequency applying apparatuses such as a high frequency heater, a nonelectrode discharge lamp and a communicating device which mainly utilize the magnetic near field for their operations. Consequently, it is possible to effectively utilize the magnetic near field generated from the high frequency electromagnetic wave generator.

The invention provides an electromagnetic wave shield comprising a plurality of electric conductors, a ground contact for carrying out a connection to a ground, and a lead wire for connecting the electric conductors to the ground contact, the electric conductors being electrically connected to the ground contact through the lead wire, wherein a wire width of each of the electric conductors ranges from 0.05 mm to 5 mm, and an average interval between the electric conductors which is obtained by dividing a length of a side on which the electric conductors and an outer periphery of a region provided with the electric conductors cross each other by a number of points on which the electric conductors and the outer periphery of the region provided with the electric conductors cross each other ranges from 4 mm to 50 mm. Therefore, the magnetic coupling of the magnetic near field of the electromagnetic wave discharged from a high frequency electromagnetic wave generator and the electromagnetic wave shield can be reduced. Therefore, it is possible to provide an electromagnetic wave shield capable of attenuating a electric far field while suppressing the attenuation of the magnetic near field. By using the electromagnetic wave shield according to the invention, it is possible to attenuate the electric far field while suppressing the attenuation of the vicinal magnetic flux as countermeasures against the unnecessary radiation of high frequency applying apparatuses such as a high frequency heater, a non-electrode discharge lamp and a communicating device which mainly utilize the magnetic near field for their operations. Consequently, it is possible to effectively utilize the magnetic near field generated from the high frequency electromagnetic wave generator.

In order to attain the object, the invention provides an electromagnetic wave shield comprising an electric conductor and a ground contact for connecting the electric conductor to a ground, the electric conductor being constituted to be electrically connected to the ground through the ground contact and being provided in such a manner that a path reaching the ground contact from an optional point of the electric conductor is uniquely determined, wherein the electric conductor is wound around.

Moreover, the invention provides a loop antenna apparatus comprising an electromagnetic wave shield on at least one surface, wherein the electromagnetic wave shield includes an electric conductor and a ground contact for connecting the electric conductor to a ground, the electric conductor is constituted to be electrically connected to the ground through the ground contact and is provided in such a manner that a path reaching the ground contact from an optional point of each of the electric conductors is uniquely determined, and the electric conductor is wound around.

According to the invention, it is possible to effectively attenuate the electric far field which is radiated from the high frequency electromagnetic wave generator or the loop antenna apparatus and becomes an unnecessary radiation while suppressing the attenuation of the magnetic near field. Consequently, it is possible to provide a high frequency electromagnetic wave generator and a loop antenna apparatus which can satisfy the regulation of the unnecessary radiation and can effectively use the magnetic near field.

DESCRIPTION OF THE PREFERRED EMBODIMENTS

An embodiment of the invention will be described below with reference to the drawings.

(First Embodiment)

Figure 1:
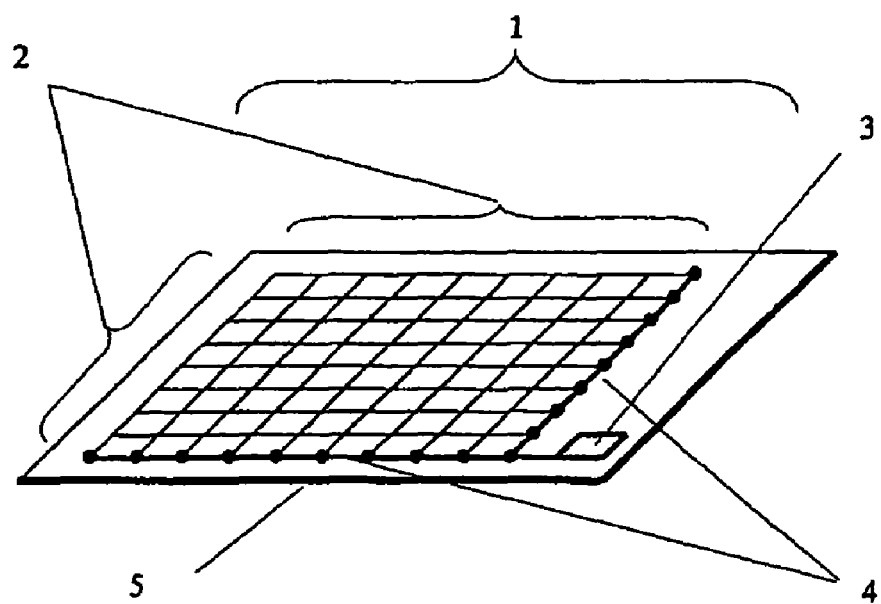
FIG. 1 is a schematic perspective view showing an electromagnetic wave shield according to a first embodiment of the invention.

FIG. 1 shows an electromagnetic wave shield according to a first embodiment as an embodiment of the invention; FIG. 1 is a schematic perspective view showing an electromagnetic wave shield according to the first embodiment of the invention.

As shown in FIG. 1, an electromagnetic wave shield 1 is constituted by a plurality of electric conductors 2, a ground contact 3 for grounding the electric conductors 2, a lead wire 4 for connecting the electric conductors 2 to the ground contact 3, and a support member 5 for holding the electric conductors 2, the ground contact 3 and the lead wire 4. The electric conductors 2 are mesh-shaped or grid-shaped. A black circle mark in the drawing indicates that an electrical connection is carried out between the electric conductors 2. In a part in which the electric conductors 2 cross each other, accordingly, a portion having no black circle mark indicates that they are not electrically connected to each other but are insulated from each other.

Figure 2:
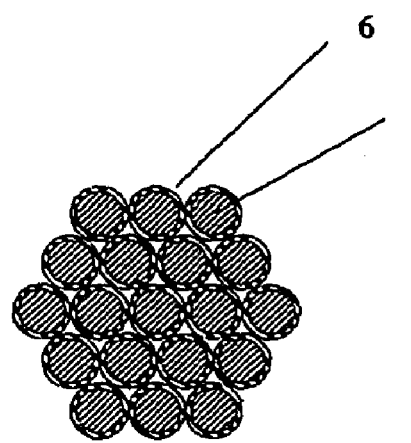
FIG. 2 is a sectional view showing an electric conductor according to the first embodiment of the invention.

In the first embodiment, a wire obtained by twisting a plurality of thin wires subjected to arm insulating cover 6, that is, a so-called litz wire is used for the electric conductors 2. FIG. 2 is a sectional view showing the electric conductor according to the first embodiment of the invention. As shown in FIG. 2, the litz wire which is used is constituted by the insulating cover 6 and a copper member 7.

As shown in FIG. 1, moreover, the litz wires to be the electric conductors 2 electrically come in contact with the lead wire 4 connected to the ground contact 3 in one place respectively. As seen electrically, it is indicated that a path is uniquely determined when following the electric conductor 2 from an optional point on the electric conductor 2 to the ground contact 3 in each of the electric conductors 2. Moreover, this implies that a closed loop connected electrically is not formed by the electric conductors 2 respectively or individually. The litz wires to be the electric conductors 2 and the lead wire 4 can come in electrical contact with each other by soldering. A copper wire having no insulating cover is used for the lead wire 4 in such a manner that the soldering with the litz wires to be the electric conductors 2 can easily be carried out. The ground contact 3 serves to obtain an electrical connection with the ground of a actual device when it is to be used in the actual device. It is preferable that the ground contact 3 can take the electrical connection to the ground of the actual device. The method includes a mechanical connecting method and a soldering method, and it is preferable that a structure corresponding to the method should be taken. In the first embodiment, a method of obtaining an electrical contact with a ground through soldering is selected and the structure is obtained by a metal plate which can easily be soldered. The litz wires to be the electric conductors 2, the lead wire 4 and the ground contact 3 are bonded and fixed onto the support member 5 formed by a resin substrate, thereby forming the electromagnetic wave shield 1 according to the first embodiment.

(Second Embodiment)

While the litz wires are used for the electric conductors 2 in the first embodiment, a solid wire of copper having an almost equal sectional area to that in the first embodiment is used to fabricate an electromagnetic wave shield 1 in a second embodiment. The electromagnetic wave shield takes almost the same shape as that shown in FIG. 1 according to the first embodiment and only the electric conductors 2 are different.

Figure 3:
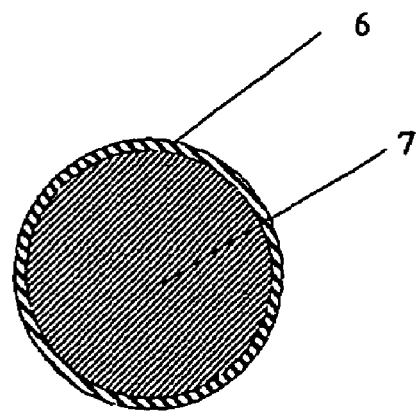
FIG. 3 is a sectional view showing an electric conductor according to a second embodiment of the invention.

FIG. 3 is a sectional view showing an electric conductor according to the second embodiment of the invention. As shown in FIG. 3, a solid wire to be used is constituted by an insulating cover 6 and a copper member 7.

In the same manner as in the first embodiment, a plurality of electric conductors 2 come in electrical contact with a lead wire 4 connected to a ground contact 3 in one place respectively in the second embodiment. As seen electrically, it is indicated that a path is uniquely determined when following the electric conductor 2 from an optional point on the electric conductor 2 to the ground contact 3 in each of the electric conductors 2. Moreover, this implies that a closed loop connected electrically is not formed by the electric conductors 2 respectively or individually. The electric conductors 2 and the lead wire 4 can come in electrical contact with each other by soldering. A copper wire having no insulating cover which can easily solder the electric conductors 2 is used for the lead wire 4. The ground contact 3 serves to obtain an electrical connection with the ground of an actual device when it is to be used in the actual device. It is preferable that the ground contact 3 can take the electrical connection to the ground of the actual device. The method includes a mechanical connecting method and a soldering method. In the second embodiment, the ground contact 3 is constituted by the same metal plate as that in the first embodiment. The electric conductors 2, the lead wires 4 and the ground contact 3 are bonded and fixed onto a support member 5 formed by a resin substrate, thereby forming the electromagnetic wave shield according to the second embodiment.

COMPARATIVE EXAMPLE

Figure 4:
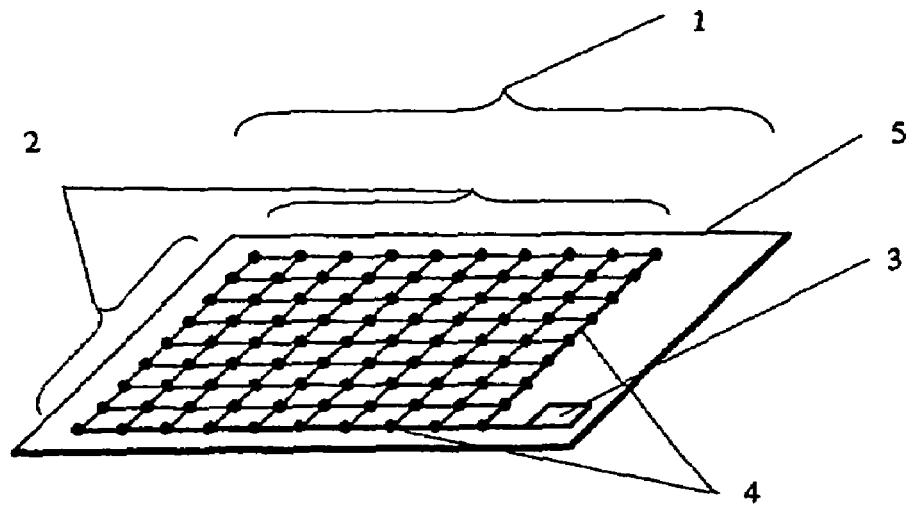
FIG. 4 is a schematic perspective view showing an electromagnetic wave shield according to a comparative example.

FIG. 4 shows an electromagnetic wave shield 1 according to a comparative example. FIG. 4 is a schematic perspective view showing the electromagnetic wave shield according to the comparative example.

As shown in FIG. 4, the electromagnetic wave shield 1 according to the comparative example is constituted by a plurality of electric conductors 2, a ground contact 3 for grounding the electric conductors 2, a lead wire 4 for connecting the electric conductors 2 to the ground contact 3, and a support member 5 for holding the electric conductors 2, the ground contact 3 and the lead wire 4 in the same manner as the electromagnetic wave shield 1 according to the first embodiment. A black circle mark in the drawing indicates that an electrical connection is carried out between the electric conductors 2.

In the same manner as in the first embodiment, a litz wire is used for the electric conductors 2 and a copper wire having no insulating cover is used for the lead wire 4. Moreover, the ground contact 3 is also constituted by a metal plate for obtaining an electrical contact with a ground through soldering in the same manner as in the first embodiment. The electric conductors 2, the lead wire 4 and the ground contact 3 are bonded and fixed onto the support member 5 formed by a resin substrate, thereby forming the electromagnetic wave shield 1 according to the comparative example.

In the first embodiment, the litz wires to be the electric conductors 2 come in electrical contact with the lead wire 4 connected to the ground contact 3 in one place respectively. On the other hand, the litz wires to be the electric conductors 2 are constituted to obtain an electrical connection in the mutual crossing portions of the litz wires as shown in the drawing in the comparative example. As seen electrically, it is indicated that there is a plurality of paths following the electric conductor 2 from an optional point on the electric conductor 2 to the ground contact 3 in each of the electric conductors 2. Moreover, this implies that a closed loop connected electrically is constituted by the electric conductors 2 respectively or individually. The electrical connection is carried out through soldering.

(Electromagnetic Wave Shielding Characteristic Evaluation Test)

Figure 5:
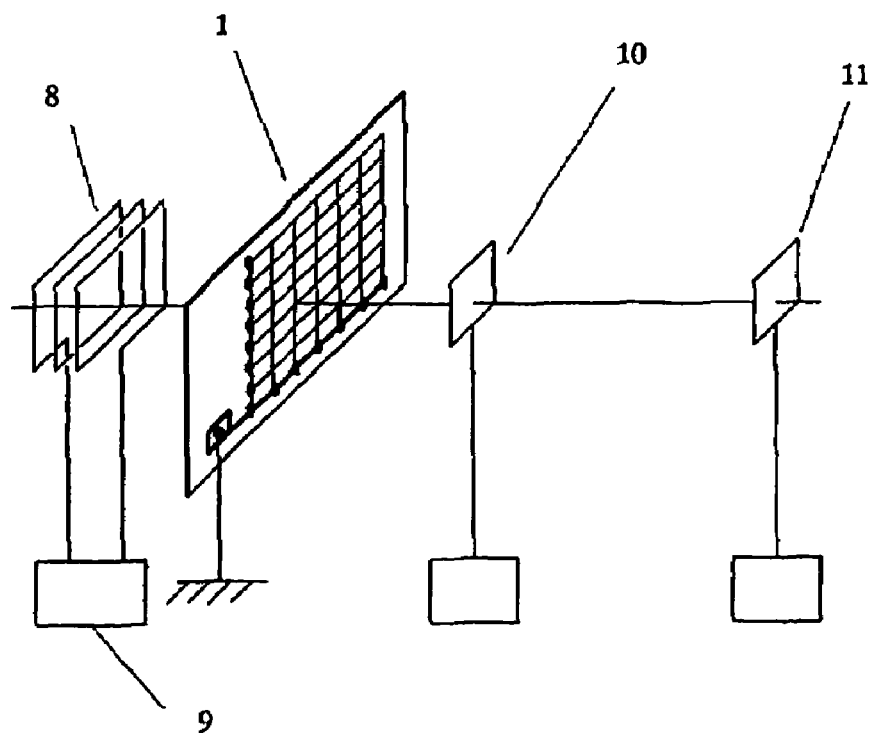
FIG. 5 is a schematic view showing the structure of an evaluation testing device.

Next, an electromagnetic wave shielding characteristic according to each of the first and second embodiments and the comparative example was examined. An evaluation test was carried out in the following manner. FIG. 5 is a schematic view showing the structure of an evaluation testing device. The evaluation testing device is constituted by an exciting coil 8 for inducing an electromagnetic wave, an exciting coil driving power supply 9, a magnetic flux intensity measuring device 10, and an electric field intensity measuring device 11. The electromagnetic wave shield 1 to be a specimen is provided in a predetermined position between the exciting coil 8 and the magnetic flux intensity measuring device 10. The exciting coil 8 was driven at a frequency of 10 MHz, and a magnetic flux intensity and an electric field intensity were measured. When the electromagnetic wave shield 1 was to be attached to the evaluation testing device, the ground contact 3 of the electromagnetic wave shield 1 took an electrical connection to a ground in the evaluation testing device. Referring to the electromagnetic wave shield 1 according to each of the first and second embodiments and the comparative example, an electromagnetic wave shielding characteristic is shown in (Table 1).

TABLE 1

| Type of electromagnetic wave shield | Magnetic near field intensity | Electric far field intensity |
|---|---|---|
| First embodiment | −0.8 dB | −4.0 dB |
| Second embodiment | −1.5 dB | −4.4 dB |
| Comparative example | −9.0 dB | −4.5 dB |
| No shield | 0 dB | 0 dB |

From the (Table 1), it can be confirmed that a reduction in the vicinal magnetic flux can be more suppressed and a electric far field intensity can be more reduced in the first embodiment as compared with the comparative example. It can be supposed that the closed loop is constituted between the electric conductors 2 so that an eddy current is generated in the closed loop formed between the electric conductors 2 by the magnetic coupling of the vicinal magnetic flux induced by the exciting coil 8 and the electromagnetic wave shield 1, resulting in an increase in the attenuation of the vicinal magnetic flux in the comparative example. In the first embodiment, as seen electrically, each of the electric conductors 2 has a structure in which a path following the electric conductor 2 from the optional point on the electric conductor 2 to the ground contact 3 is uniquely determined or a structure in which the closed loop connected electrically is not formed by each of the electric conductors 2. Therefore, it is possible to suppress the magnetic coupling of the vicinal magnetic flux induced by the exciting coil 8 and the electromagnetic wave shield 1. Accordingly, it is also possible to control the generator of an eddy current, thereby suppressing the attenuation of the vicinal magnetic flux.

In the first embodiment, furthermore, the litz wires formed by the aggregate of the thin wires are used for the electric conductors 2. Therefore, the generation of the eddy current induced in the electric conductor 2 can also be suppressed. Accordingly, the magnetic coupling of the electric conductor 2 and the vicinal magnetic flux can be suppressed under a high frequency magnetic flux of 10 MHz, for example. Thus, the attenuation of the vicinal magnetic flux can be restrained. Referring to the electric far field intensity, moreover, the electric conductor 2 is set to have a ground potential so that an almost equal attenuation to that in the comparative example can be attained In the first embodiment, thus, the attenuation of the vicinal magnetic flux can be suppressed to reduce the electric far field intensity. Therefore, it is possible to easily take countermeasures against the unnecessary radiation of high frequency applying apparatuses such as a high frequency heater, a nonelectrode discharge lamp and a communicating device which mainly utilize the vicinal magnetic flux for their operations, and furthermore, it is possible to effectively use the magnetic near field generated from a high frequency electromagnetic wave generator.

Also in the second embodiment, moreover, it can be confirmed, from the (Table 1), that the electric far field intensity can be more reduced without a great reduction in the magnetic near field as compared with the comparative example.

It can be supposed that the closed loop is constituted between the electric conductors 2 so that an eddy current is generated in the closed loop formed between the electric conductors 2 by the magnetic coupling of the vicinal magnetic flux induced by the exciting coil 8 and the electromagnetic wave shield 1, resulting in an increase in the attenuation of the vicinal magnetic flux in the comparative example. In the second embodiment, as seen electrically, each of the electric conductors 2 has a structure in which a path following the electric conductor 2 from the optional point on the electric conductor 2 to the ground contact 3 is uniquely determined or a structure in which the closed loop connected electrically is not formed by the electric conductors 2 respectively or individually. Therefore, it is possible to suppress the magnetic coupling of the vicinal magnetic flux induced by the exciting coil 8 and the electromagnetic wave shield 1. Accordingly, it is also possible to control the generation of the eddy current, thereby suppressing the attenuation of the vicinal magnetic flux.

On the other hand, in the first embodiment, the litz wire is used for the electric conductor 2. Therefore, the generation of the eddy current induced in the electric conductor 2 can also be suppressed so that the attenuation of the vicinal magnetic flux can be restrained. In the second embodiment, although the sectional area of the electric conductor 2 is almost equal to that in the first embodiment, a solid wire is used and a wire diameter is increased. Consequently, the magnetic coupling of the vicinal magnetic flux and the electric conductor is generated at the frequency of 10 MHz which is used in the test. Accordingly, the eddy current is induced into the electric conductor 2 so that the degree of the attenuation of the vicinal magnetic flux is more increased as compared with that in the first embodiment. As compared with the comparative example, however, the degree of the attenuation of the vicinal magnetic flux is lower. Referring to the electric far field intensity, furthermore, almost the same attenuating effect as that in the comparative example can be obtained because the electric conductor 2 has a ground potential.

Also in the second embodiment, accordingly, the attenuation of the vicinal magnetic flux can be suppressed to reduce the magnetic field intensity. Therefore, it is possible to easily take countermeasures against the unnecessary radiation of high frequency applying apparatuses such as a high frequency heater, a non-electrode discharge lamp and a communicating device which mainly utilize the vicinal magnetic flux for their operations, and furthermore, it is possible to effectively use the vicinal magnetic flux generated from a high frequency electromagnetic wave generator.

It is preferable that the optimum sectional area of the electric conductor 2 should be selected depending on the frequency of an electromagnetic wave to be shielded as shown in the first and second embodiments. More specifically, it is desirable that the sectional area of the electric conductor 2 should be small in case of an electromagnetic wave having a high frequency, and the sectional area of the electric inductor 2 does not particularly need to be reduced in case of an electromagnetic wave having a low frequency. In the case in which the frequency is high and the sectional area of the electric conductor 2 is small, however, a deterioration in the effect of shielding a electric far field can be found. In this case, however, it is possible to solve the problem of the deterioration in the effect of shielding the electric far field in the case in which the sectional area is decreased by using the aggregate of the thin wires having small sectional areas, that is, the so called litz wire or increasing the number of the electric conductors 2 per area of the electric conductors 2 as described in the first embodiment. More specifically, it is preferable to determine the sectional area of the electric conductor 2 corresponding to the frequency of the electromagnetic wave, thereby deciding the surface density of the electric conductor 2 or the number of the twisted wires of the litz wire in order to optimize the effect of shielding the electric far field.

Although the sectional shape of the thin wire constituting the litz wire to be the electric conductor or the solid wire which is used is almost circular, the sectional shape is not restricted to the circle. If the interlinkage area of the electric conductor constituting the electromagnetic wave shield and the vicinal magnetic flux is small and the sectional shape is isotropic, the magnetic flux is attenuated irrespective of the direction of incidence of an electromagnetic wave. Depending on a place in which the electromagnetic wave shield is provided, in addition to an electromagnetic wave which is directly incident on the electromagnetic wave shield from a source for generating an electromagnetic wave, an electromagnetic wave incident through the reflection of the surroundings of the generating source is also generated. The direction of the incidence of the electromagnetic wave incident on the electromagnetic wave shield through the reflection of the surroundings is set to be omnidirectional. For this reason, it is desirable that the sectional shape of the electric conductor constituting the electromagnetic wave shield should be isotropic.

On the other hand, in the case in which the sectional shape of the thin wire constituting the litz wire to be the electric conductor or the solid wire is not isotropic but flat, the degree of the attenuation of the vicinal magnetic flux is varied depending on the direction of the incidence of an electromagnetic wave. In the case in which the sectional shape of the electric conductor is not isotropic and the dimension of the shape of the electric conductor is to be determined; it is necessary to set such a dimension that an eddy current is generated with difficulty in consideration of the frequency of the electromagnetic wave to be shielded when particularly determining a dimension in the major axis direction of the electric conductor which is not isotropic.

While an insulating covering member is used for the covering member for obtaining an electrical insulating property between the electric conductors 2 in the embodiment, moreover, it is preferable that the covering member of the electric conductor 2 should have an optimum material and structure corresponding to the frequency of an electromagnetic wave to be an object For example, in some cases in which the frequency of the electromagnetic wave is increased, the insulating property between the electric conductors 2 is reduced by capacitive coupling between the electric conductors 2. In such cases, it is preferable to select the thickness or dielectric constant of the covering member in such a manner that the electrical insulating property can be maintained between the electric conductors 2.

While the electric conductors 2, the ground contact 3 and the lead wire 4 are provided, bonded and fixed onto the support member 5 constituted by a resin to form the electromagnetic wave shield 1 in the first and second embodiments, a method of carrying out the fixation onto the support member 5 is not restricted to the bonding. If a binding pin capable of binding the electric conductor 2 onto the support member 5 is provided, for example, the electric conductors 2 are wound upon the binding pin and are thus fixed so that the electromagnetic wave shield 1 can be formed. In this case, there is no problem if each of the electric conductors 2 is set to have an arrangement in which a path following the electric conductor 2 from the optional point on the electric conductor 2 to the ground contact 3 is uniquely determined or an arrangement in which a closed loop connected electrically is not formed by the electric conductors 2 respectively or individually when the electric conductors 2 are seen electrically.

Figure 6:
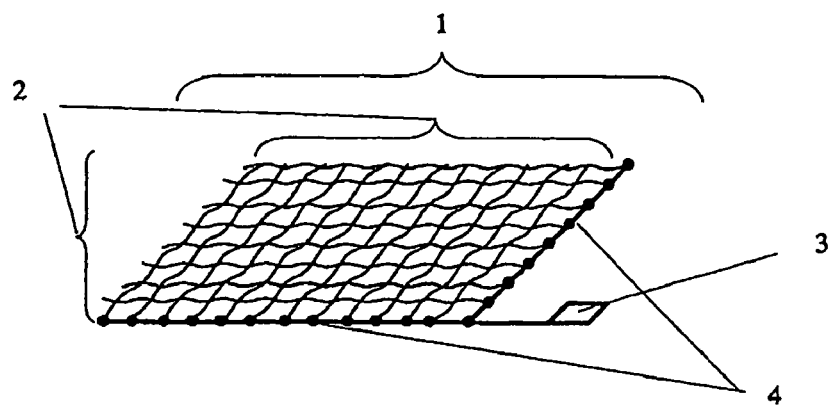
FIG. 6 is a schematic perspective view showing another configuration of the electromagnetic wave shield according to the embodiment of the invention.

In the first and second embodiments, moreover, the electric conductors 2, the ground contact 3 and the lead wire 4 are provided, bonded and fixed onto the support member 5 constituted by a resin to form the electromagnetic wave shield 1, and they are provided, bonded and fixed onto the support member 5 in order to easily handle the electromagnetic wave shield 1. Referring to an influence on the characteristics of the electromagnetic wave shield, it is not necessary to always provide the support member 5. FIG. 6 is a schematic perspective view showing another configuration of the electromagnetic wave shield according to the embodiment of the invention. For example, as typically shown in FIG. 6, even if the electric conductors 2 are braided and thus constituted in the arrangement of the electric conductors 2 crossing each other vertically and transversely in the same manner as in the first embodiment, there is no problem if each of the electric conductors 2 is set to have an arrangement in which a path following the electric conductor 2 from the optional point on the electric conductor 2 to the ground contact 3 is uniquely determined or an arrangement in which a closed loop connected electrically is not formed by the electric conductors 2 respectively or individually when the electric conductors 2 are seen electrically. In the case in which the support member 5 is not provided, it is preferable that the lead wire 4 and the grand contact 3 should be constituted by braiding with the electric conductors 2, for example. It is sufficient that the lead wire 4 has the function of electrically bonding the electric conductors 2 to the ground contact 3. Moreover, it is sufficient that the ground of an actual device for attaching the electromagnetic wave shield 1 and the ground contact 3 of the electromagnetic wave shield 1 can be bonded electrically to each other. With such a structure, the support member 5 is not provided so that it is possible to obtain a feature that bending can easily be carried out and an electromagnetic wave generating portion can readily be covered.

Figure 7:
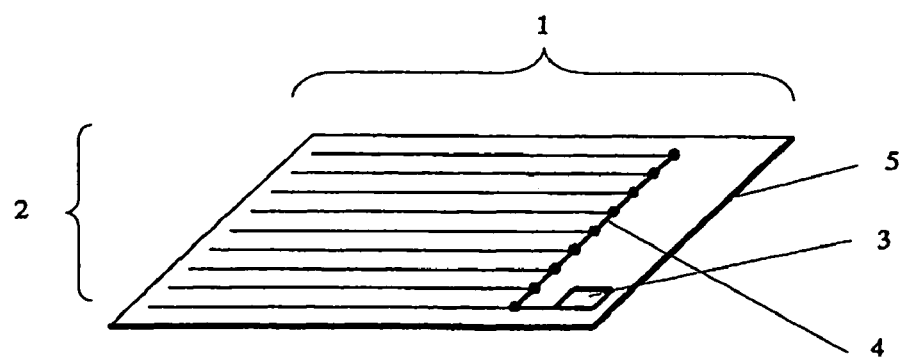
FIG. 7 is a schematic perspective view showing a further configuration of the electromagnetic wave shield according to the embodiment of the invention.
Figure 8:
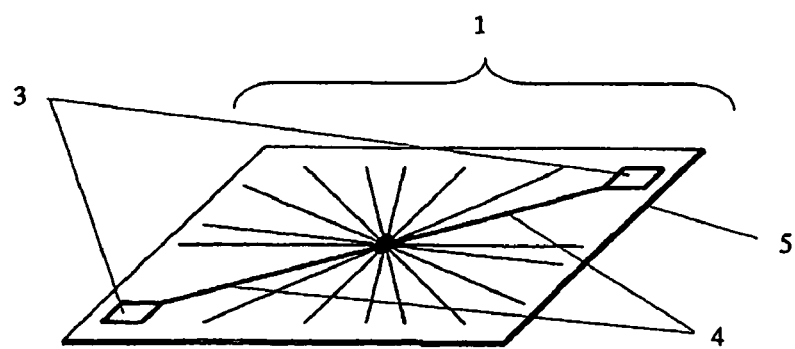
FIG. 8 is a schematic perspective view showing a further configuration of the electromagnetic wave shield according to the embodiment of the invention.

While the electric conductors 2 are arranged vertically and transversely to constitute the electromagnetic wave shield 1 in the first and second embodiments, moreover, the electric conductors 2 do not need to be provided vertically and transversely but may have structures shown in FIGS. 7 and 8, for example. FIGS. 7 and 8 are schematic perspective views showing another configuration of the electromagnetic wave shield according to the embodiment of the invention. In short, it is preferable that the electric conductor 2 should be provided corresponding to the intensity of an electromagnetic wave generated from the electromagnetic wave generating portion and a desirable shielding characteristic. In that case, when the electric conductors 2 are electrically seen, there is no problem if each of the electric conductors 2 is set to have an arrangement in which a path following the electric conductor 2 from the optional point on the electric conductor 2 to the ground contact 3 is uniquely determined or an arrangement in which a closed loop connected electrically is not formed by the electric conductors 2 respectively or individually.

While the lead wire 4 for connecting the electric conductors 2 to the ground contact 3 is provided on one of the sides of the electromagnetic wave shield 1 in the first and second embodiments, moreover, the arrangement of the lead wire 4 is not restricted thereto. For example, in the case in which the area of the electromagnetic wave shield 1 is increased and the lengths of the electric conductors 2 are increased, a potential difference is made between an end of each of the electric conductors 2 which is caused to come in electrical contact with the lead wire 4 and the other end. In some cases in which the lead wire 4 is provided in an asymmetrical position over the surface of the electromagnetic wave shield 1 as in the first and second embodiments, thus, a shielding characteristic, for example, the asymmetry of a electric far field intensity in a distant place is increased. In such cases, it is preferable that the lead wire 4 of the electromagnetic wave shield 1 should be provided in an almost symmetrical position. In this case, examples shown in FIGS. 9 and 10 can be supposed for a method of arranging the electric conductor 2, for instance. When the electric conductors 2 are seen electrically, there is no problem if each of the electric conductors 2 is set to have an arrangement in which a path following the electric conductor 2 from the optional point on the electric conductor 2 to the ground contact 3 is uniquely determined or an arrangement in which a closed loop connected electrically is not formed by the electric conductors 2 respectively or individually. It is necessary to care about the pull of the lead wire 4 itself so as not to form the closed loop. Moreover, FIGS. 9 and 10 are schematic perspective views showing other configurations of the electromagnetic wave shield according to the embodiment of the invention.

Figure 9:
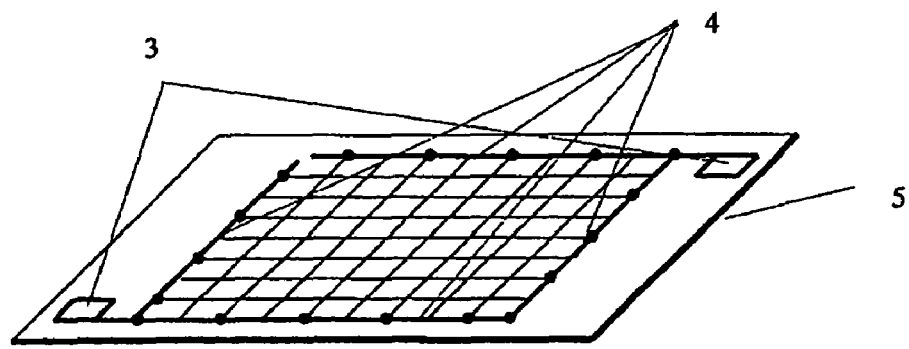
FIG. 9 is a schematic perspective view showing a further configuration of the electromagnetic wave shield according to the embodiment of the invention.
Figure 10:
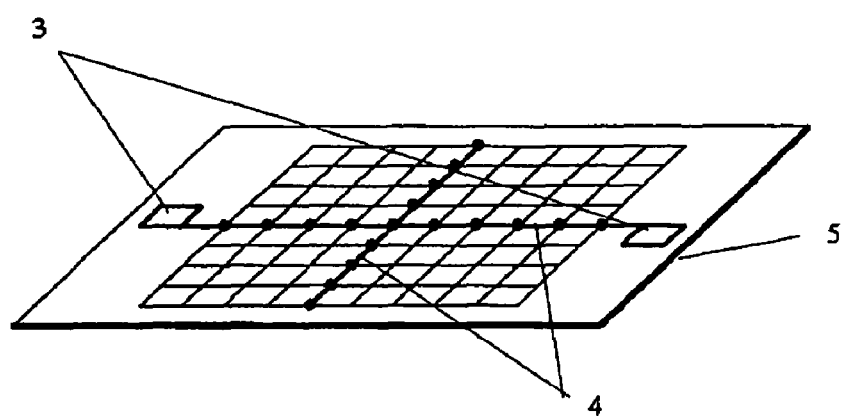
FIG. 10 is a schematic perspective view showing a further configuration of the electromagnetic wave shield according to the embodiment of the invention.

For example, in the case in which the ground contact 3 is provided in two places over the electromagnetic wave shield 1 as shown in FIGS. 9 and 10, the ground contacts 3 in the two places form a closed loop through an actual device to be the object of the electromagnetic wave shield 1 when the electromagnetic wave shield 1 is provided in the actual device and the ground of the actual device is connected to the ground contact 3 of the electromagnetic wave shield 1. Also in this case, an arrangement in which a path following the electric conductor 2 from the optional point on the electric conductor 2 to the ground contact 3 is uniquely determined or an arrangement in which a closed loop connected electrically is not formed by the electric conductors 2 respectively or individually is held in each of the electric conductors 2 over the electromagnetic wave shield 1 according to the invention when the electric conductors 2 are seen electrically. Consequently, the magnetic coupling of the electromagnetic wave shield and a vicinal magnetic flux generated from the actual device is rarely generated. In the case in which the ground contacts 3 provided in the two places form the closed loop through the actual device, however, it is necessary to connect the ground contact 3 of the electromagnetic wave shield 1 to the ground of the actual, device by taking care so as not to interlink the vicinal, magnetic flux generated from the actual device with the closed loop formed by the installation.

In the electromagnetic wave shield according to the invention, thus, the attenuation of the vicinal magnetic flux can be suppressed to reduce the electric far field intensity. Therefore, it is possible to easily take countermeasures against the unnecessary radiation of high frequency applying apparatuses such as a high frequency heater, a non-electrode discharge lamp and a communicating device which mainly utilize the vicinal magnetic flux for their operations, and furthermore, it is possible to effectively use the vicinal magnetic flux generated from a high frequency electromagnetic wave generator.

(Third Embodiment)

An electromagnetic wave is usually discharged three-dimensionally. In the case in which an unnecessary electromagnetic wave is to be shielded, therefore, it is necessary to three-dimensionally shield a source for generating an electromagnetic wave. An electromagnetic wave shield 1 according to a third embodiment can solve the problem by employing a structure in which the source for generating an electromagnetic wave is covered.

Figure 11:
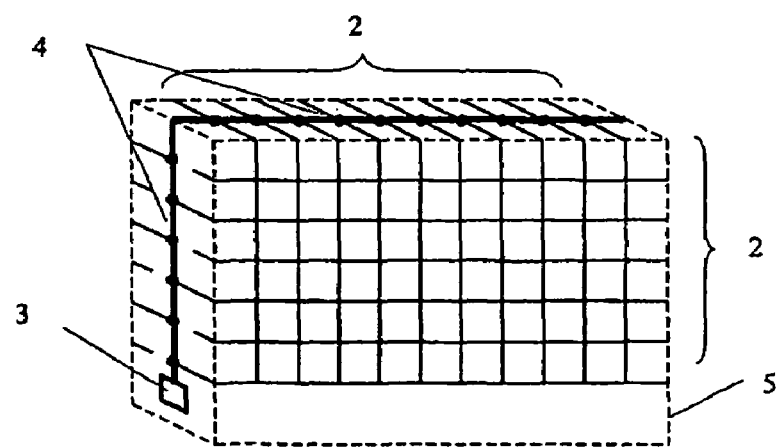
FIG. 11 is a schematic perspective view showing an electromagnetic wave shield according to a third embodiment of the invention.

FIG. 11 shows the electromagnetic wave shield 1 according to the third embodiment. FIG. 11 is a schematic perspective view showing the electromagnetic wave shield according to the third embodiment of the invention. The electromagnetic wave shield 1 according to the third embodiment is constituted by a plurality of electric conductors 2, a ground contact 3 for grounding the electric conductors 2, a lead wire 4 for connecting the electric conductors 2 to the ground contact 3, and a box-shaped support member 5 for holding the electric conductors 2, the ground contact 3 and the lead wire, 4. A black circle mark in the drawing indicates that an electrical connection is carried out between the electric conductors 2. In a part in which the electric conductors 2 cross each other, accordingly, a portion having no black circle mark indicates that they are not electrically connected to each other but are insulated from each other.

In the third embodiment, a wire obtained by twisting a plurality of thin wires subjected to an insulating cover, that is a so-called litz wire is used for the electric conductors 2. The litz wire is constituted by a copper wire.

As shown in FIG. 11, the litz wires to be the electric conductors 2 electrically come in contact with the lead wire 4 connected to the ground contact 3 in one place respectively. As seen electrically, it is indicated that a path is uniquely determined when following the electric conductor 2 from an optional point on the electric conductor 2 to the ground contact 3 in each of the electric conductors 2. Moreover, this implies that a closed loop connected electrically is not formed by the electric conductors 2 respectively or individually. The litz wires to be the electric conductors 2 and the lead wire 4 can come in electrical contact with each other by soldering. A copper wire which can easily be soldered to the litz wires to be the electric conductors 2 and has no insulating cover is used for the lead wire 4. The ground contact 3 serves to obtain an electrical connection with the ground of an actual device when it is to be used in the actual device. It is preferable that the ground contact 3 can take the electrical connection to the ground of the actual device. The method includes a mechanical connecting method and a soldering method, and it is preferable that a structure corresponding to the method should be taken. In the first embodiment, a method of obtaining an electrical contact with a ground through soldering is selected and the structure is obtained by a metal plate which can easily be soldered. The electric conductors 2, the lead wire 4 and the ground contact 3 are bonded and fixed onto the box-shaped support member 5 constituted by a resin material, thereby forming the electromagnetic wave shield 1 according to the third embodiment.

(Electromagnetic Wave Shielding Characteristic Evaluation Test)

Next, an electromagnetic wave shielding characteristic according to the third embodiment was examined. An evaluation test was carried out in the following manner. FIG. 5 is a schematic view showing the structure of an evaluation test. The evaluation testing device is constituted by an exciting coil 8 for inducing an electromagnetic wave, an exciting coil driving power supply 9, a magnetic flux intensity measuring device 10, and an electric field intensity measuring device 11. The electromagnetic wave shield 1 to be a specimen is provided in a predetermined position between the exciting coil 8 and the magnetic flux intensity measuring device 10. The exciting coil 8 was driven at a frequency of 10 MHz, and a magnetic flux intensity and an electric field intensity were measured. When the electromagnetic wave shield 1 was to be attached to the evaluation testing device, the ground contact 3 of the electromagnetic wave shield 1 took an electrical connection to a ground in the evaluation testing device. Referring to the electromagnetic wave shield 1 according to the third embodiment, an electromagnetic wave shielding characteristic is shown in (Table 2).

TABLE 2

| Type of electromagnetic wave shield | Magnetic near field intensity | Electric far field intensity |
|---|---|---|
| Third embodiment | −1.1 dB | −6.5 dB |
| No shield | 0 dB | 0 dB |

From the (Table 2), it can be confirmed that a electric far field intensity can further be reduced without greatly reducing the vicinal magnetic flux in the third embodiment as compared with the case in the first embodiment. While the planar electromagnetic field is shielded in the first embodiment, consequently, the whole exciting coil 8 is covered in the third embodiment. Accordingly, an electromagnetic wave component radiated by turning around the planar electromagnetic wave shield 1 is also shielded. Thus, the electric far field intensity can further be reduced as compared with the first embodiment. In addition, in the third embodiment, as seen electrically, each of the electric conductors 2 has a structure in which a path following the electric conductor 2 from the optional point on the electric conductor 2 to the ground contact 3 is uniquely determined or a structure in which the closed loop connected electrically is not formed by the electric conductors 2. Therefore, it is possible to suppress the magnetic coupling of the vicinal magnetic flux induced by the exciting coil 8 and the electromagnetic wave shield 1. Accordingly, it is also possible to control the generation of an eddy current, thereby suppressing the attenuation of the vicinal magnetic flux.

In the third embodiment, furthermore, the litz wires formed by the aggregate of the thin wires are used for the electric conductors 2. Therefore, the generation of the eddy current induced in the electric conductor 2 can also be suppressed. Accordingly, the magnetic coupling of the electric conductor 2 and the vicinal magnetic flux can be suppressed under a high frequency magnetic flux of 10 MHz, for example. Thus, the attenuation of the vicinal magnetic flux can be restrained.

In the third embodiment, thus, the attenuation of the vicinal magnetic flux can be suppressed to reduce the electric far field, intensity. Therefore, it is possible to easily take countermeasures against the unnecessary radiation of high frequency applying apparatuses such as a high frequency heater, a nonelectrode discharge lamp and a communicating device which mainly utilize the vicinal magnetic flux for their operations, and furthermore, it is possible to effectively use the vicinal magnetic flux generated from a high frequency electromagnetic wave generator. In addition, since the electromagnetic wave shield takes the shape of a box in the third embodiment, it is sufficient that the source for generating an electromagnetic field is put therein and an installation can be thus carried out easily.

In the same manner as in the first embodiment, it is preferable that the optimum sectional area of the electric conductor 2 should be selected depending on the frequency of an electromagnetic wave to be shielded in the third embodiment. More specifically, it is desirable that the sectional area of the electric conductor 2 should be small in case of an electromagnetic wave having a high frequency, and the sectional area of the electric conductor 2 does not particularly need to be reduced in case of an electromagnetic wave having a low frequency. In the case in which the frequency is high and the sectional area of the electric conductor 2 is small, however, a deterioration in the effect of shielding a electric far field can be found. In this case, however, it is possible to solve the problem of the deterioration in the effect of shielding the electric far field in the case in which the sectional area is decreased by using the aggregate of the thin wires having small sectional areas, that is, the so-called litz wire or increasing the number of the electric conductors 2 per area of the electric conductors 2. More specifically, it is preferable to determine the sectional area of the electric conductor 2 corresponding to the frequency of the electromagnetic wave, thereby deciding the surface density of the electric conductor 2 or the number of the twisted wires of the litz wire in order to optimize the effect of shielding the electric far field.

While the electric conductors 2, the ground contact 3 and the lead wire 4 are provided, bonded and fixed onto the box-shaped support member 5 constituted by a resin to form the electromagnetic wave shield 1 in the third embodiment, moreover, a method of carrying out the fixation onto the support member 5 is not restricted to the bonding. If a binding pin capable of binding the electric conductor 2 onto the support member 5 is provided, for example, the electric conductors 2 are bound onto the binding pin so that the electromagnetic wave shield 1 can be formed.

In this case, there is no problem if each of the electric conductors 2 is set to have an arrangement in which a path following the electric conductor 2 from the optional point on the electric conductor 2 to the ground contact 3 is uniquely determined or an arrangement in which a closed loop connected electrically is not formed by the electric conductors 2 respectively or individually when the electric conductors 2 are seen electrically.

In the third embodiment, moreover, the electric conductors 2, the ground contact 3 and the lead wire 4 are provided, bonded and fixed onto the box-shaped support member 5 constituted by a resin to form the electromagnetic wave shield 1, they are provided, bonded and fixed onto the box-shaped support member 5 in order to easily handle the electromagnetic wave shield 1. Referring to an influence on the characteristics of the electromagnetic wave shield 1, it is not necessary to always provide the box-shaped support member 5.

Figure 12:
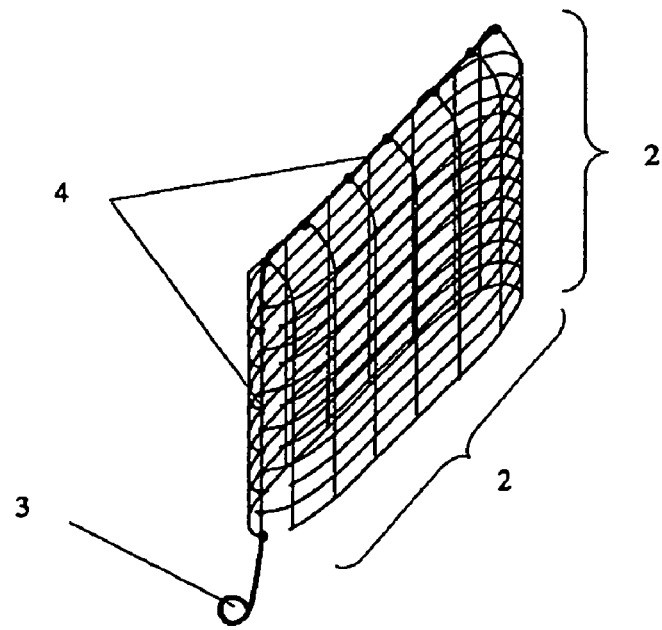
FIG. 12 is a schematic perspective view showing a further configuration of the electromagnetic wave shield according to the embodiment of the invention.
Figure 13:
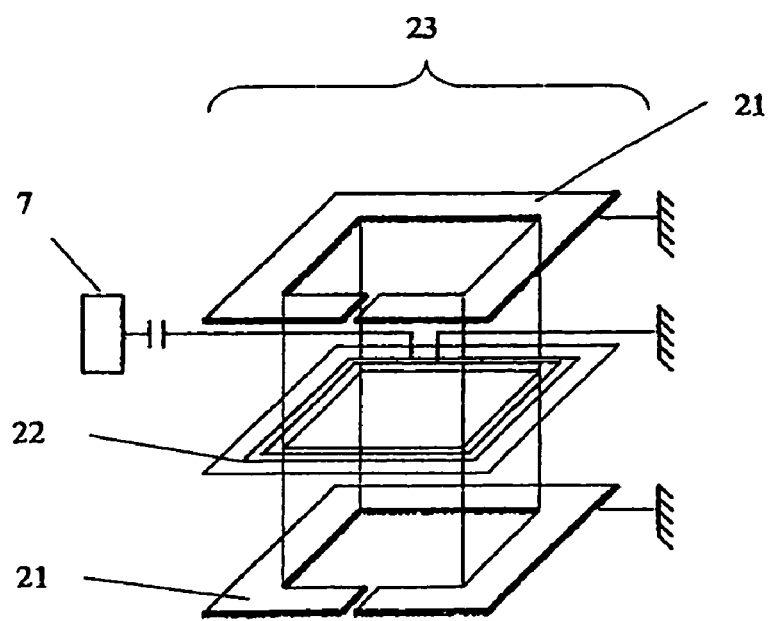
FIG. 13 is a schematic perspective view showing a conventional electromagnetic wave shield.

FIG. 12 is a schematic perspective view showing another configuration of the electromagnetic wave shield according to the embodiment of the invention. For example, as typically shown in FIG. 12, even if the electric conductors 2 are braided and thus constituted in the arrangement of the electric conductors 2 crossing each other vertically and transversely in the same manner as in the third embodiment, there is no problem if each of the electric conductors 2 is set to have an arrangement in which a path following the electric conductor 2 from the optional point on the electric conductor 2 to the ground contact 3 is uniquely determined or an arrangement in which a closed loop connected electrically is not formed by the electric conductors 2 respectively or individually when the electric conductors 2 are seen electrically. In the case in which the support member 5 is not provided, it is preferable that the lead wire 4 and the grand contact 3 should be constituted by braiding with the electric conductors 2, for example. It is sufficient that the lead wire 4 has the function of electrically bonding the electric conductors 2 to the ground contact 3. Moreover, it is sufficient that the ground of an actual device for attaching the electromagnetic wave shield 1 and the ground contact 3 of the electromagnetic wave shield 1 can be bonded electrically to each other. With such a structure, the support member 5 is not provided so that it is possible to obtain a feature that bending can easily be carried out and an electromagnetic wave generating portion can readily be covered.

While the electric conductors 2 are arranged vertically and transversely to constitute the electromagnetic wave shield 1 in the third embodiment, moreover, the electric conductors 2 do not need to be provided vertically and transversely. In short, it is preferable that the electric conductor 2 should be provided corresponding to the intensity of an electromagnetic wave generated from the electromagnetic wave generating portion and a desirable shielding characteristic. In that case, when the electric conductors 2 are electrically seen, there is no problem if each of the electric conductors 2 is set to have an arrangement in which a path following the electric conductor 2 from the optional point on the electric conductor 2 to the ground contact 3 is uniquely determined or an arrangement in which a closed loop connected electrically is not formed by the electric conductors 2 respectively or individually.

While the lead wire 4 for connecting the electric conductors 2 to the ground contact 3 is provided on one of the sides of the electromagnetic wave shield 1 in the third embodiment, moreover, the arrangement of the lead wire 4 is not restricted thereto. For example, in the case in which the area of the electromagnetic wave shield 1 is increased and the lengths of the electric conductors 2 are increased, a potential difference is made between an end of each of the electric conductors 2 which is caused to come in electrical contact with the lead wire 4 and the other end. In some cases in which the lead wire 4 is provided in an asymmetrical position over the surface of the electromagnetic wave shield 1 as in the first and second embodiments, thus, a shielding characteristic, for example, the asymmetry of a electric far field intensity is increased. In such cases, it is preferable that the lead wire 4 of the electromagnetic wave shield 1 should be provided in an almost symmetrical position. In that case, when the electric conductors 2 are seen electrically, there is no problem if each of the electric conductors 2 is set to have an arrangement in which a path following the electric conductor 2 from the optional point on the electric conductor 2 to the ground contact 3 is uniquely determined or an arrangement in which a closed loop connected electrically is not formed by the electric conductors 2 respectively or individually.

In the case in which the ground contact 3 is provided in a plurality of places over the electromagnetic wave shield 1, moreover, the ground contacts a in the places form a closed loop through an actual device to be a electromagnetic wave shielding object when the electromagnetic wave shield 1 is provided in the, actual device and the ground of the actual device is connected to the ground contact 3 of the electromagnetic wave shield 1. Also in this case, an arrangement in which a path following the electric conductor 2 from the optional point on the electric conductor 2 to the ground contact 3 is uniquely determined or an arrangement in which a closed loop connected electrically is not formed by the electric conductors 2 respectively or individually is held in each of the electric conductors 2 over the electromagnetic wave shield 1 according to the invention when the electric conductors 2 are seen electrically. Consequently, the magnetic coupling of the electromagnetic wave shield 1 and a vicinal magnetic flux generated from the actual device is rarely generated. In the case in which the ground contacts 3 form the closed loop through the actual device, however, it is necessary to connect the ground contact 3 of the electromagnetic wave shield 1 to the ground of the actual device by taking care so as not to interlink the vicinal magnetic flux generated from the actual device with the closed loop formed by the installation.

In the electromagnetic wave shield according to the invention, thus, the attenuation of the vicinal magnetic flux can be suppressed to reduce the electric far field intensity. Therefore, it is possible to easily take countermeasures against the unnecessary radiation of high frequency applying apparatuses such as a high frequency heater, a non-electrode discharge lamp and a communicating device which mainly utilize the vicinal magnetic flux for their operations, and furthermore, it is possible to effectively use the vicinal magnetic flux generated from a high frequency electromagnetic wave generator.

The electromagnetic wave shield according to the invention comprises a plurality of electric conductors, a ground contact for carrying out a connection to a ground, and a lead wire for connecting the electric conductors to the ground contact, the electric conductors being electrically connected to the ground contact through the lead wire, wherein the electric conductors are provided in such a manner that a path reaching the ground contact through the lead wire from an optional point of each of the electric conductors is uniquely determined. Therefore, it is possible to provide an electromagnetic wave shield capable of reducing the magnetic coupling of the vicinal magnetic flux of an electromagnetic wave discharged from a high frequency electromagnetic wave generator and the electromagnetic wave shield, and attenuating a electric far field while suppressing the attenuation of the vicinal magnetic flux.

By using the electromagnetic wave shield according to the invention it is possible to attenuate the electric far field while suppressing the attenuation of the vicinal magnetic flux as counter measures against the unnecessary radiation of high frequency applying apparatuses such as a high frequency heater, a non-electrode discharge lamp and a communicating device which mainly utilize the vicinal magnetic flux for their operations. Consequently, it is possible to effectively utilize the vicinal magnetic flux generated from a high frequency electromagnetic wave generator.

(Fourth Embodiment)

Figure 14:
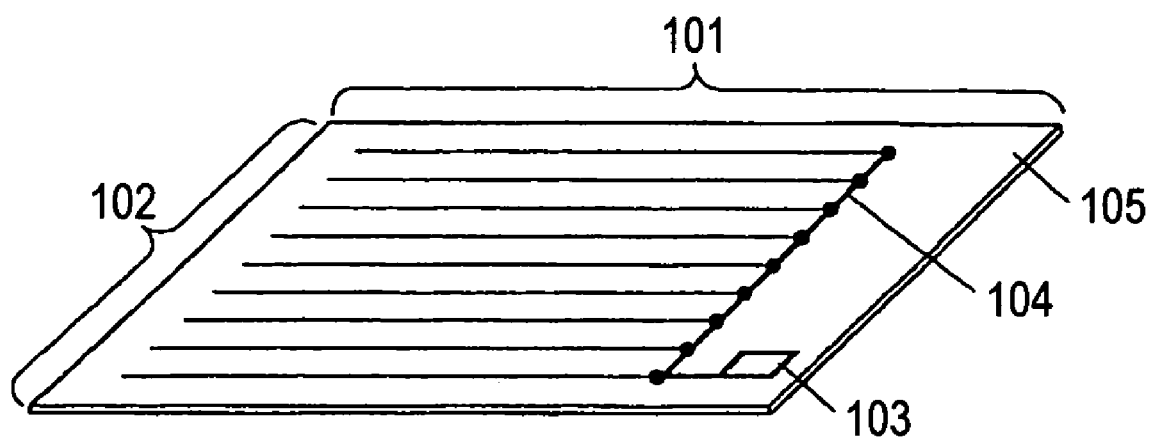
FIG. 14 is a schematic perspective view showing an electromagnetic wave shield according to a fourth embodiment of the invention.
Figure 15:
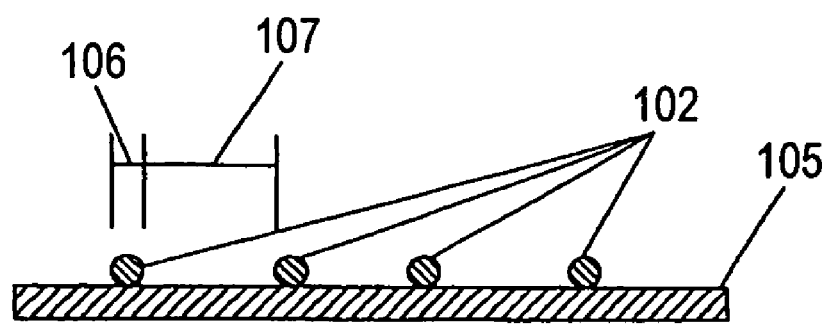
FIG. 15 is a partial sectional view showing the electromagnetic wave shield according to the fourth embodiment of the invention.

FIG. 14 is a schematic perspective view showing an electromagnetic wave shield according to a fourth embodiment of the invention. The electromagnetic wave shield 101 according to the fourth embodiment is constituted by a plurality of electric conductors 102, a ground contact 103 for grounding the electric conductors 102, a lead wire 104 for connecting the electric conductors 102 to the ground contact 103, and a support member 105 for holding the electric conductors 102, the ground contact 103 and the lead wire 104. A black circle mark in the drawing indicates that an electrical connection is carried out between the electric conductors 102. In a part in which the electric conductors 102 cross each other, accordingly, a portion having no black circle mark indicates a state in which they are not electrically connected to each other but are insulated from each other. In the fourth embodiment, a wire subjected to insulation covering is used for the electric conductors 102.

As shown in FIG. 14, the electric conductors 102 electrically come in contact with the lead wire 104 connected to the ground contact 103 in one place respectively. As seen electrically, it is indicated that a path is uniquely determined when following the electric conductor 102 from an optional point on the electric conductor 102 to the ground contact 103 in each of the electric conductors 102. Moreover, this implies that a closed loop connected electrically is not formed by the electric conductors 102 respectively or individually. The electric conductors 102 and the lead wire 104 can come in electrical contact with each other by soldering. A copper wire having no insulating cover is used for the lead wire 104 in such a manner that the soldering with the electric conductors 102 can easily be carried out. The ground contact 103 serves to obtain an electrical connection with the ground of an actual device when it is to be used in the actual device. It is preferable that the ground contact 103 can take the electrical connection to the ground of the actual device. The method includes a mechanical connecting method and a soldering method, and it is, preferable that a structure corresponding to the method should be taken. In the fourth embodiment, a method of obtaining an electrical contact with a ground through soldering is selected and the structure is obtained by a metal plate which can easily be soldered. The electric conductors 102, the lead wire 104 and the ground contact 103 are bonded and fixed onto a support member 105 formed by a resin substrate, thereby forming the electromagnetic wave shield according to the fourth embodiment.

There is shown the partial section of the electromagnetic wave shield according to the fourth embodiment of the invention. The electromagnetic wave shield according to the fourth embodiment is defined by a wire width 106 of each of the electric conductors 102 and an average interval 107 between the electric conductors 102. The average interval 107 is obtained by dividing the length of a side on which the electric conductors and the outer periphery of a region provided with the electric conductors 102 cross each other by the number of points on which the electric conductors and the outer periphery of the region provided with the electric conductors cross each other.

With the structure according to the fourth embodiment, the wire width 106 of each of the electric conductors 102 and the average interval 107 between the electric conductors 102 were varied to fabricate the electromagnetic wave shield 101 and a change in the characteristics of the electromagnetic wave shield 101 with the wire width 106 of each of the electric conductors 102 and the average interval 107 between the electric conductors 102 was examined. While a bulk wire is used for the electric conductors 102 in the fourth embodiment, the wire width 106 of the bulk wire implies the maximum width of the bulk wire, that is, the diameter of the bulk wire.

Figure 16:
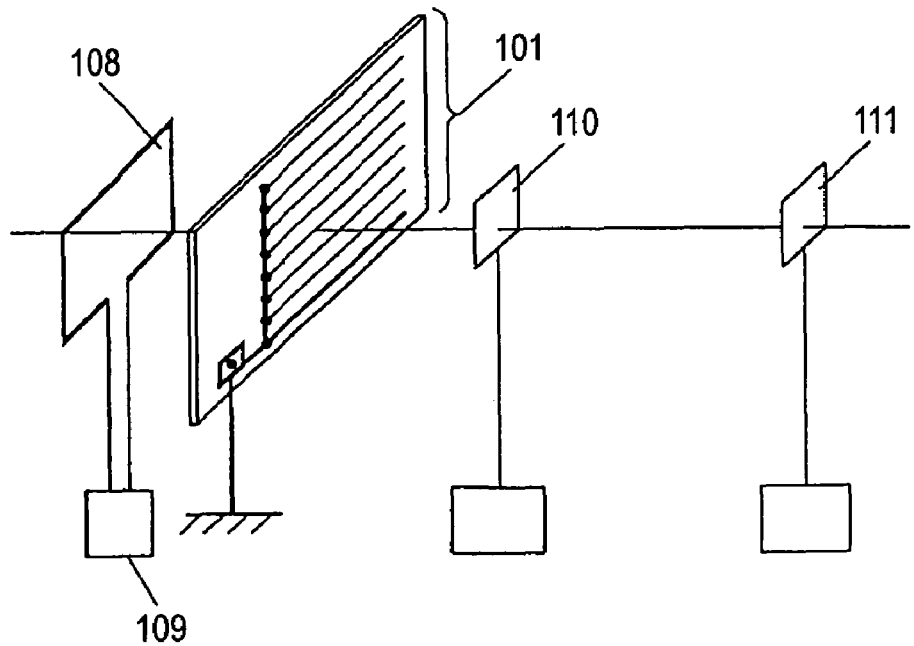
FIG. 16 is a schematic view showing the structure of an evaluation testing device.

An evaluation test was carried out in the following manner. FIG. 16 is a schematic view showing the structure of an evaluation testing device. The evaluation testing device is constituted by a loop antenna 108 for inducing an electromagnetic wave, a loop antenna driving power supply 109, a magnetic field intensity measuring device 110, and an electric field intensity measuring device 111. The electromagnetic wave shield 101 to be a specimen is provided in a predetermined position between the loop antenna 108 and the magnetic field intensity measuring device 110. The loop antenna 108 was driven at a frequency of 10 MHz and a magnetic field intensity and an electric field intensity were measured. When the electromagnetic wave shield 101 was to be attached to the evaluation testing device, the ground contact 103 of the electromagnetic wave shield 101 took an electrical connection to a ground in the evaluation testing device.

Figure 17:
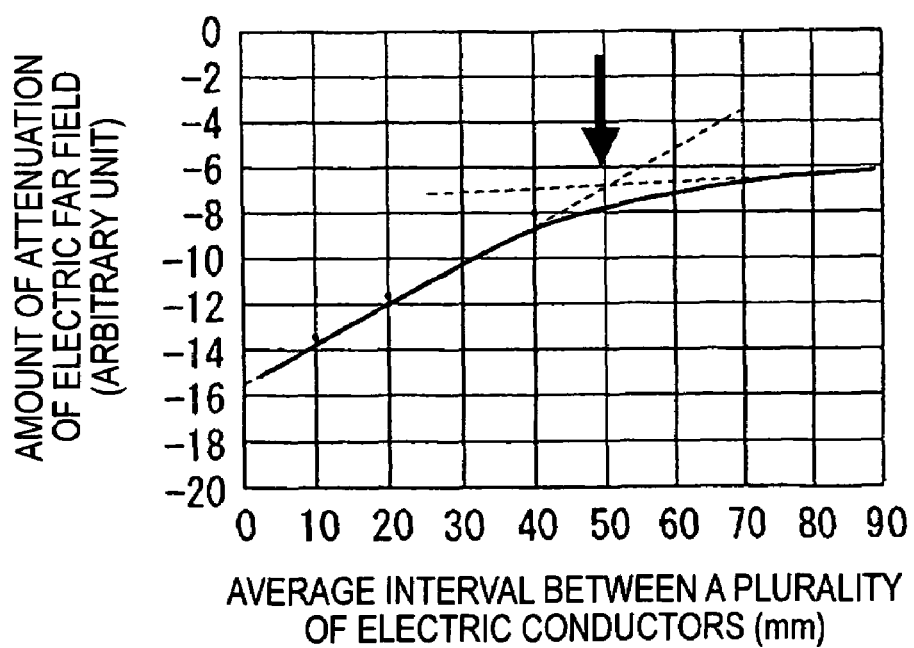
FIG. 17 is graph showing a shielding characteristic related to a electric far field according to the fourth embodiment of the invention.

FIG. 17 shows the attenuation characteristic of the electric far field intensity of the electromagnetic wave shield 101 thus fabricated. It is apparent from FIG. 17 that the amount of the attenuation of the electric far field intensity is more increased when the average interval 107 between the electric conductors 102 is reduced. More specifically, it is apparent that the average interval 107 between the electric conductors 102 is preferably reduced in order to attenuate the electric far field intensity. Moreover, it is apparent that the amount of the attenuation of the electric far field intensity and the average interval 107 between the electric conductors 102 have such a relationship that an inflection point is present in the proximity of a place in which the average interval 107 between the electric conductors 102 is 50 mm. More specifically, if the average interval 107 between the electric conductors 102 is greater than approximately 50 mm, the change in the amount of the attenuation of the electric far field intensity is reduced. It is required that the electric far field intensity is attenuated. Accordingly, it is apparent that the average interval 107 between the electric conductors 102 to effectively take the attenuation of the electric far field intensity greatly should be set to be equal to or smaller than approximately 50 mm.

Figure 18:
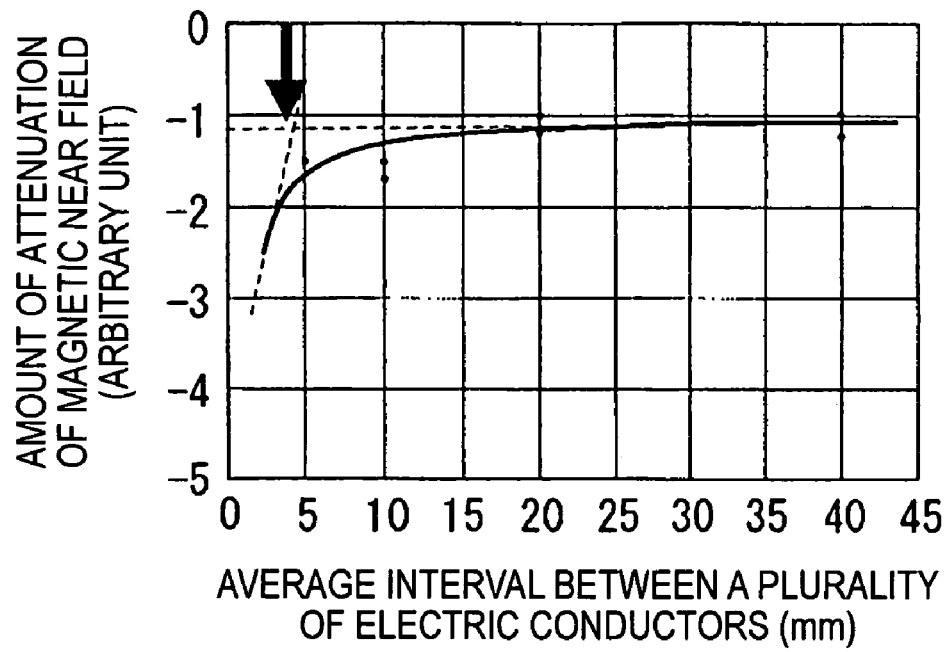
FIG. 18 is graph showing a shielding characteristic related to a magnetic near field according to the fourth embodiment of the invention.

Moreover, FIG. 18 shows the attenuation characteristic of the magnetic near field intensity of the electromagnetic wave shield 101. It is apparent that the magnetic near field intensity is stable in a region in which the average interval 107 between the electric conductors 102 is great and the amount of the attenuation of the magnetic near field intensity is gradually increased when the average interval 107 between the electric conductors 102 is smaller than approximately 10 mm. It is indicated that the amount of the attenuation of the magnetic near field intensity is suddenly increased when the average interval 107 between the electric conductors 102 is approximately 3 mm. For the characteristic of the electromagnetic wave shield 101, it is required that the attenuation of the magnetic near field intensity is as small as possible. Accordingly, it is apparent that the average interval 107 between the electric conductors 102 should be set to be equal to or greater than approximately 104 mm in order to maintain the amount of the attenuation of the magnetic near field intensity to be small.

Figure 19:
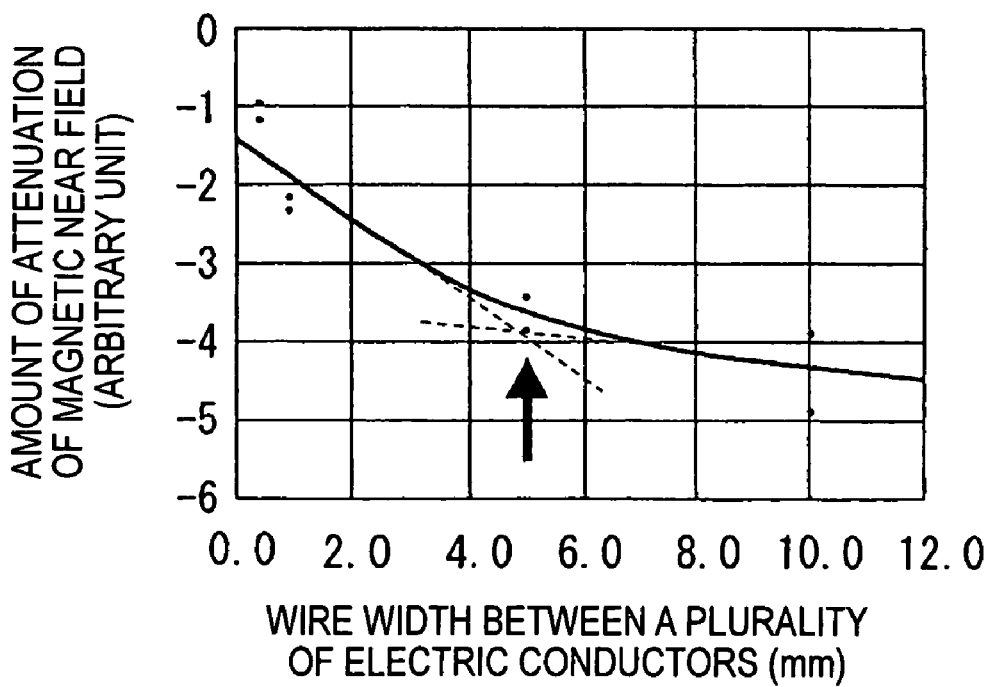
FIG. 19 is graph showing a shielding characteristic related to the magnetic near field according to the fourth embodiment of the invention.

Moreover, FIG. 19 shows a computer simulation result for a change in the magnetic near field intensity with a variation in the wire width 106 of each of the electric conductors 102. It is indicated that the magnetic near field intensity is increased when the wire width 106 of each of the electric conductors 102 is reduced. To the contrary, it is indicated that the magnetic near field intensity is decreased when the wire width 106 of each of the electric conductors 102 is increased. For the characteristic of the electromagnetic wave shield 101, it is required that the attenuation of the magnetic near field intensity is reduced. In FIG. 19, it is indicated that a change in the magnetic field intensity is reduced with respect to the wire width 106 of each of the electric conductors 102 when the wire width 106 of each of the electric conductors 102 is equal to or greater than approximately 5 mm. In order to reduce the attenuation of the magnetic near field intensity, accordingly, the wire width 106 of each of the electric conductors 102 is to be smaller than approximately 5 mm. The wire width 106 of each of the electric conductors 102 is obtained as seen in the direction of the normal of the electromagnetic wave shield 101. For example, if the electric conductor is a cylindrical wire, the wire width 106 is equivalent to a diameter thereof.

From this result, it is preferable that the wire width 106 of each of the electric conductors 102 of the electromagnetic wave shield 101 should be smaller in order to transmit the magnetic near field intensity without increasing the attenuation of the magnetic near field intensity. However, in the case in which the wire width 106, that is, a wire diameter in a bulk wire is gradually decreased, for example, there is a problem of handling in that the bulk wire is apt to be cut. In consideration of this respect, it is desirable that the wire width 106 of each of the electric conductors 102 should be greater than approximately 0.05 mm. If a litz wire to be the aggregate of thin wires is previously used when the wire width 106 is small, it is easy to handle the wire in the fabrication of the electromagnetic wave shield 101 while holding the characteristic of the thin wire, that is, such a characteristic as to efficiently transmit the magnetic near field intensity. Consequently, this is effective for enhancing a productivity.

As described above, conditions to meet the range of the wire width 106 of each of the electric conductors 102 to be satisfied by the electric conductors 102 and the range of the average interval 107 between the electric conductors 102 is clear in the electromagnetic wave shield 101 for transmitting a magnetic near field and shielding a electric far field. More specifically, it is preferable that the electric conductors 102 in the electromagnetic wave shield 101 for transmitting the magnetic near field and shielding the electric far field should have the wire width 106 of approximately 0.05 mm to 5 mm and the average interval 107 of 4 mm to 50 mm.

For the following reasons, there is used the average interval 107 obtained by dividing the length of a side on which the electric conductors and the outer periphery of the region provided with the electric conductors cross each other by the number of points on which the electric conductors and the outer periphery of the region provided with the electric conductors cross each other.

More specifically, it is found that the arrangement of the electric conductors 102 exhibits a shielding characteristic having few drawbacks even if the adjacent electric conductors 102 to each other are not provided in parallel. In the case in which the electric conductors 102 are to be provided on a surface to be shielded, it is preferable that the electric conductors 102 should be provided within the range of the average interval 107 used therein as long as they are provided without an extreme deviation.

In the case in which the electromagnetic wave shield is fabricated without meeting the conditions of the electromagnetic wave shield, the following problems arise.

For example, in the case in which the wire width 106 of each of the electric conductors 102 is set to be equal to or smaller than approximately 0.05 mm, any problem does not arise over the transmitting property of the magnetic near field. However, the electric conductor 102 is broken very easily. For this reason, the electric conductor 102 is hard to handle and a drawback is generated in a mass production. When the electric conductors 102 to be used have the wire width 106 which is greater than approximately 5 mm, moreover, they are coupled to the magnetic near field so that the transmitting property of the magnetic near field in the electromagnetic wave shield 101 is deteriorated. If the electric conductors 102 have the wire width 106 of approximately 5 mm or more, furthermore, the electric conductors 102 themselves are easily coupled to the magnetic near field even if the average interval 107 between the electric conductors 102 is changed. For this reason, it is hard to enhance the transmitting property of the magnetic near field.

Moreover, in the case in which the average interval 107 between the electric conductors 102 is smaller than approximately 4 mm, for example, the coupling of the electric conductors 102 and the magnetic near field is so increased as to have an effect and the transmitting property of the magnetic near field of the electromagnetic wave shield 101 is deteriorated. For example, in the case in which the average interval 107 between the electric conductors 102 is set to be greater than approximately 50 mm, furthermore, the transmitting property of the electric far field is increased so that the shielding property of the electric far field to be originally shielded is deteriorated.

In a summary, in such an electromagnetic wave shield 101 as to shield the electric far field and to transmit the magnetic near field, a path following the electric conductor 102 from an optional point on the electric conductor 2 to the ground contact 103 is uniquely determined or the electric conductors 102 are coupled to the ground contact 103 so as not to form a closed loop in each of the electric conductors 102. The wire width of each of the electric conductors is to range from 0.05 mm to 5 mm and the average interval between the electric conductors obtained by dividing the length of a side on which the electric conductors and the outer periphery of the region provided with the electric conductors cross each other by the number of points on which the electric conductors and the outer periphery of the region provided with the electric conductors crops each other is to range from 4 mm to 50 mm.

(Table 3) shows a result obtained by fabricating an electromagnetic wave shield having an average interval of 20 mm between electric conductors having a wire diameter of 0.35 mm based on the conditions which are obtained, setting the electromagnetic wave shield into an actual communicating machine including a loop antenna having a side of 150 mm, thereby examining the intensity of a magnetic near field and the amount of the attenuation of a electric far field.

TABLE 3

| | |
|---|---|
| Amount of attenuation of electric far field intensity (dB) | −13 |
| Amount of attenuation of magnetic near field intensity (dB) | −1.5 |

From the (Table 3), it can be confirmed that the electromagnetic wave shield can function to transmit the magnetic near field and to shield the electric far field also in the actual communicating machine.

In the fourth embodiment, the electromagnetic wave shield 101 is fabricated by using the bulk wire. If the electromagnetic wave shield 101 comprises a plurality of electric conductors 102, a ground contact 103 for carrying out a connection to a ground, and a lead wire 104 for connecting the electric conductors 102 to the ground contact 103, the electric conductors 102 being electrically connected to the ground contact 103 through the lead wire 104 and being provided in such a manner that a path reaching the ground contact 103 through the lead wire 104 from an optional point on each of the electric conductors 102 is uniquely determined, wherein a wire width of each of the electric conductors ranges from 0.05 mm to 5 mm, and an average interval between the electric conductors which is obtained by dividing a length of a side on which the electric conductors and an outer periphery of a region provided with the electric conductors cross each other by a number of points on which the electric conductors and the outer periphery of the region provided with the electric conductors cross each other ranges from 4 mm to 50 mm, the electric conductors 102 are not restricted to the bulk wire.

For example, even if the electromagnetic wave shield is fabricated by using a printed circuit board, the electromagnetic wave shielding characteristic to shield an electric field and to transmit a magnetic field is not changed at all. A method of fabricating the electromagnetic wave shield 1 by using an etching process for a printed circuit board is excellent in a productivity. In the method, however, it is hard to set the wire width 106 of each of the electric conductors 102 to be small, that is, 0.05 mm as in a bulk wire. While the wire width of each of the electric conductors 102 which can be stably fabricated on the printed circuit board by the etching process is equal to or greater than approximately 0.2 mm, this sufficiently meets the conditions to be satisfied by the electric conductors 102 obtained in the fourth embodiment and such a characteristic as to shield an electric field and to transmit a magnetic field without an attenuation can be satisfied as described in the fourth embodiment.

For the condition that the wire width of each of the electric conductors 102 is equal to or smaller than 5 mm, the transmitting property of the magnetic field and the shielding property of the electric field have no problem even if the electric conductor 102 having a wire diameter of approximately 5 mm is used. In case of the electric conductor 102 having the wire diameter of approximately 5 mm, the rigidity of the electric conductor 102 itself is increased so that a handling property has a drawback. In such a case, if the electromagnetic wave shield 101 is constituted by using a conductive foil member having 9 wire width of approximately 5 mm, for example, it is also possible to enhance the handling property while maintaining the transmitting property of the magnetic field and the shielding property of the electric field.

While the electric conductors 102, the ground contact 103 and the lead wire 104 are provided, bonded and fixed onto the support member 105 constituted by a resin to form the electromagnetic wave shield 1 in the fourth embodiment, a method of carrying out the fixation onto the support member 5 is not restricted to the bonding. If a binding pin capable of binding the electric conductor 102 onto the support member 105 is provided, for example, the electric conductors 102 are wound upon the binding pin and are thus fixed so that the electromagnetic wave shield 1 can be formed. In this case, there is no problem if each of the electric conductors 102 is set to have an arrangement in which a path following the electric conductor 102 from the optional point on the electric conductor 102 to the ground contact 103 is uniquely determined or an arrangement in which a closed loop connected electrically is not formed by the electric conductors 102 respectively or individually when the electric conductors 102 are electrically seen, and the wire width of each of the electric conductors ranges from 0.05 mm to 5 mm and the average interval between the electric conductors which is obtained by dividing the length of the side on which the electric conductors and the outer periphery of the region provided with the electric conductors cross each other by the number of the points on which the electric conductors and the outer periphery of the region provided with the electric conductors cross each other ranges from 4 mm to 50 mm.

Figure 20:
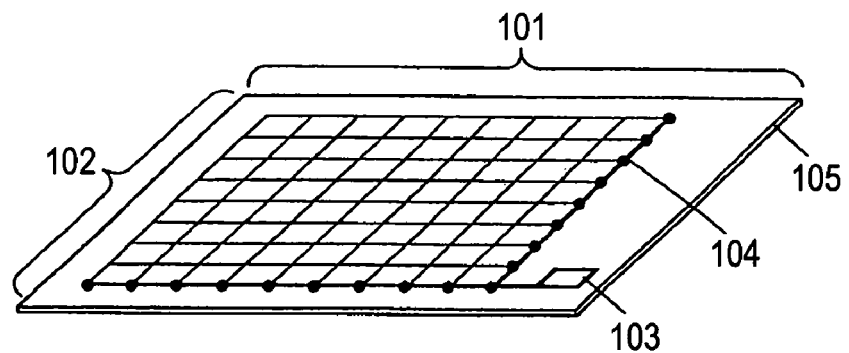
FIG. 20 is a schematic perspective view showing another configuration of the electromagnetic wave shield according to the fourth embodiment of the invention.
Figure 21:
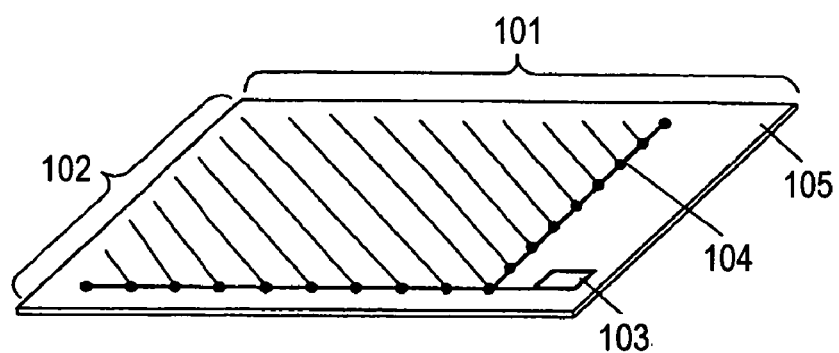
FIG. 21 is a schematic perspective view showing a further configuration of the electromagnetic wave shield according to the fourth embodiment of the invention.
Figure 22:
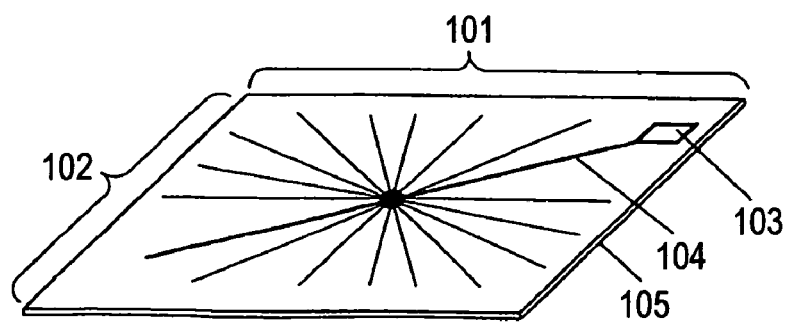
FIG. 22 is a schematic perspective view showing a further configuration of the electromagnetic wave shield according to the fourth embodiment of the invention.

While the electric conductors 102 are arranged in a vertical direction to constitute the electromagnetic wave shield 101 in the fourth embodiment, moreover, the electric conductors 102 do not need to be provided in the vertical direction but may have structures shown in FIGS. 20 to 22, for example. In short, it is preferable that the electric conductor 102 should be provided corresponding to the intensity of an electromagnetic wave generated from an electromagnetic wave generating portion and a desirable shielding characteristic. In that case, when the electric conductors 102 are electrically seen, there is no problem for the basic characteristic of the electromagnetic wave shield for transmitting a magnetic field and shielding an electric field if each of the electric conductors 102 is set to have an arrangement in which a path following the electric conductor 102 from the optional point on the electric conductor 102 to the ground contact 103 is uniquely determined or an arrangement in which a closed loop connected electrically is not formed by the electric conductors 102 respectively or individually, and the wire width of each of the electric conductors, ranges from 0.05 mm to 5 mm and the average interval between the electric conductors which is obtained by dividing the length of the side on which the electric conductors and the outer periphery of the region provided with the electric conductors cross each other by the number of the points on which the electric conductors and the outer periphery of the region provided with the electric conductors cross each other is set to range from 4 mm to 50 mm.

Figure 23:
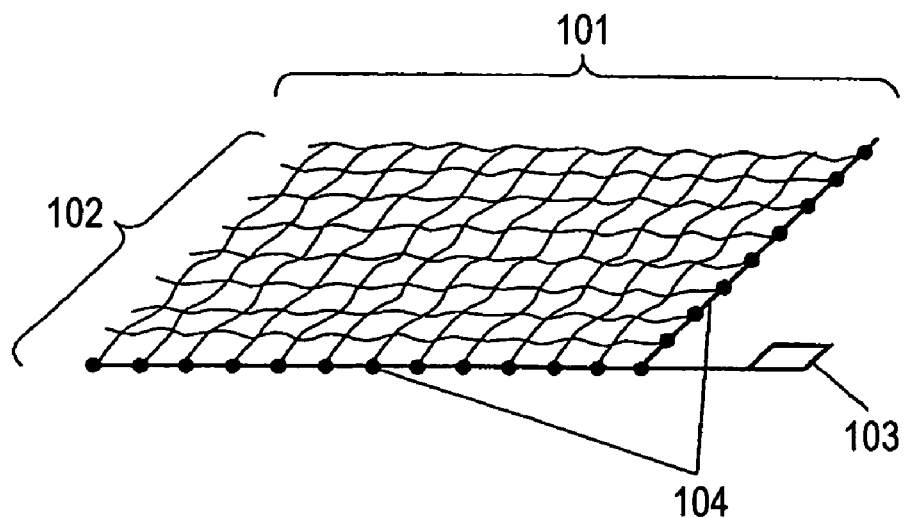
FIG. 23 is a schematic perspective view showing a further configuration of the electromagnetic wave shield according to the fourth embodiment of the invention.

While the electric conductors 102, the ground contact 103 and the lead wire 104 are provided, bonded and fixed onto the support member 105 constituted by a resin to form the electromagnetic wave shield 101 in the fourth embodiment, furthermore, they are provided, bonded and fixed onto the support member 105 in order to easily handle the electromagnetic wave shield 101. Referring to an influence on the characteristics of the electromagnetic wave shield 1, it is not necessary to always provide the support member 105. For example, as typically shown in FIG. 23, even if the electric conductors 102 are braided and thus constituted in the arrangement of the electric conductors 102 crossing vertically and transversely, there is no problem if each of the electric conductors 102 is set to have an arrangement in which a path following the electric conductor 102 from the optional point on the electric conductor 102 to the ground contact 103 is uniquely determined or an arrangement in which a closed loop connected electrically is not formed by the electric conductors 102 respectively or individually when the electric conductors 102 are seen electrically, and the wire width of each of the electric conductors ranges from 0.05 mm to 5 mm and the average interval between the electric conductors which is obtained by dividing the length of the side on which the electric conductors and the outer periphery of the region provided with the electric conductors cross each other by the number of the points on which the electric conductors and the outer periphery of the region provided with the electric conductors cross each other is set to range from 4 mm to 50 mm. In the case in which the support member 5 is not provided, it is preferable that the lead wire 104 and the grand contact 103 should be constituted by braiding with the electric conductors 102, for example. It is sufficient that the lead wire 104 has the function of electrically bonding the electric conductors 102 to the ground contact 103. Moreover, it is sufficient that the ground of an actual device for attaching the electromagnetic wave shield 101 and the ground contact 103 of the electromagnetic wave shield 101 can be bonded electrically to each other. With such a structure, the support member 105 is not provided so that it is possible to obtain a feature that bending can easily be carried out and an electromagnetic wave generating portion can readily be covered. While FIG. 23 shows the case in which the electric conductor is provided vertically and transversely, there is no problem for the shielding characteristic even if the electric conductor is used in only the vertical direction and a non-conductive member for holding the electric conductor in the vertical direction is used in the transverse direction, and they are braided, for example.

While the lead wire 104 for connecting the electric conductors 102 to the ground contact 103 is provided on one of the sides of the electromagnetic wave shield 101 in the fourth embodiment, moreover, the arrangement of the lead wire 104 is not restricted thereto. For example, in the case in which the area of the electromagnetic wave shield 101 is increased and the lengths of the electric conductors 102 are increased, a potential difference is made between an end of each of the electric conductors 102 which is caused to come in electrical contact with the lead wire 104 and the other end. In some cases in which the lead wire 104 is provided in an asymmetrical position over the surface of the electromagnetic wave shield 1 as in the fourth embodiment, thus, a shielding characteristic, for example, the asymmetry of a electric far field intensity in a distant place is increased. In such cases, it is preferable that the lead wire 104 of the electromagnetic wave shield 101 should be provided in an almost symmetrical position. In this case, an example shown in FIG. 24 can be supposed for a method of arranging the electric conductor 102, for instance. There is no problem if each of the electric conductors 102 is set to have an arrangement in which a path following the electric conductor 2 from the optional point on the electric conductor 102 to the ground contact 103 is uniquely determined or an arrangement in which a closed loop connected electrically is not formed by the electric conductors 102 respectively or individually when the electric conductors 102 are seen electrically, and the wire width of each of the electric conductors ranges from 0.05 mm to 5 mm and the average interval between the electric conductors which is obtained by dividing the length of the side on which the electric conductors and the outer periphery of the region provided with the electric conductors cross each other by the number of the points on which the electric conductors and the outer periphery of the region provided with the electric conductors cross each other ranges from 4 mm to 50 mm. It is necessary to care about the pull of the lead wire 104 itself so as not to form the closed loop.

Figure 24:
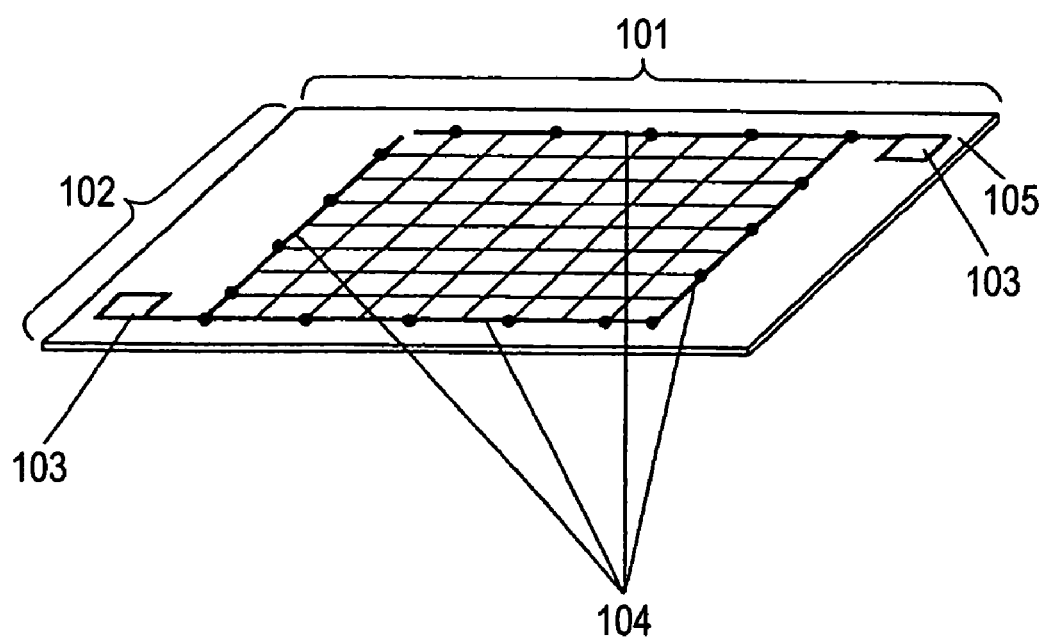
FIG. 24 is a schematic perspective view showing a further configuration of the electromagnetic wave shield according to the fourth embodiment of the invention.

For example, in the case in which the ground contact 103 is provided in two places over the electromagnetic wave shield 1 as shown in FIG. 24, the ground contacts 103 in the two places form a closed loop through an actual device to be the object of the electromagnetic wave shield 101 when the electromagnetic wave shield 101 is provided in the actual device and the ground of the actual device is connected to the ground contact 103 of the electromagnetic wave shield 101. Also in this case, an arrangement in which a path following the electric conductor 102 from the optional point on the electric conductor 102 to the ground contact 103 is uniquely determined or an arrangement in which a closed loop connected electrically is not formed by the electric conductors 102 respectively or individually is held in each of the electric conductors 102 over the electromagnetic wave shield 101 according to the invention when the electric conductors 102 are seen electrically. Consequently, the magnetic coupling of the electromagnetic wave shield 101 and a magnetic near field generated from the actual device is rarely generated. In the case in which the ground contacts 103 provided in the two places form the closed loop through the actual device, however, it is necessary to connect the ground contact 103 of the electromagnetic wave shield 101 to the ground of the actual device by taking care so as not to interlink the vicinal magnetic flux generated from the actual device with the closed loop formed by the installation.

In the electromagnetic wave shield 101 according to the invention, thus, the attenuation of the magnetic near field can be suppressed to reduce the electric far field intensity. Therefore, it is possible to easily take countermeasures against the unnecessary radiation of high frequency applying apparatuses such as a high frequency heater, a non-electrode discharge lamp and a communicating device which mainly utilize the magnetic near field for their operations, and furthermore, it is possible to effectively use the magnetic near field generated from a high frequency electromagnetic wave generator.

(Fifth Embodiment)

An electromagnetic wave is usually discharged three-dimensionally. In the case in which an unnecessary electromagnetic wave is to be shielded, therefore, it is necessary to three-dimensionally shield a source for generating an electromagnetic wave. An electromagnetic wave shield 101 according to a fifth embodiment can solve the problem by employing a structure in which the source for generating an electromagnetic wave is covered.

Figure 25:
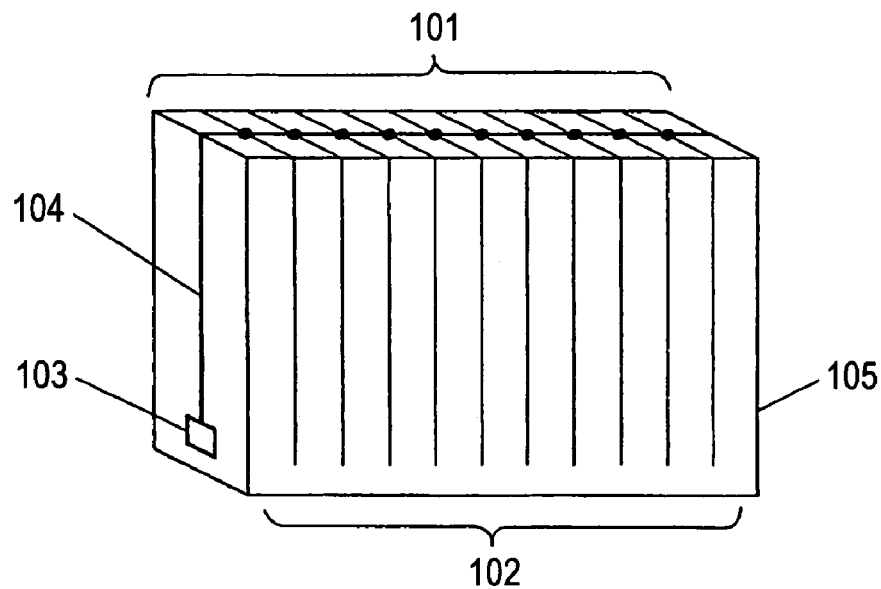
FIG. 25 is a schematic perspective view showing an electromagnetic wave shield according to a fifth embodiment of the invention.

FIG. 25 is a schematic perspective view showing the electromagnetic wave shield 1 according to the fifth embodiment. The electromagnetic wave shield 101 according to the fifth embodiment is constituted by a plurality of electric conductors 102, a ground contact 103 for grounding the electric conductors 102, a lead wire 104 for connecting the electric conductors 102 to the ground contact 103, and a box-shaped support member 105 for holding the electric conductors 102, the ground contact 103 and the lead wire 104. A black circle mark in the drawing indicates that the electric conductors 102 and the lead wire 104 are electrically connected to each other.

As shown in FIG. 25, the copper wires of the electric conductors 102 electrically come in contact with the lead wire 4 connected to the ground contact 103 in one place respectively. As seen electrically, it is indicated that a path is uniquely determined when following the electric conductor 102 from an optional point on the electric conductor 102 to the ground contact 103 in each of the electric conductors 102. Moreover, this implies that a closed loop connected electrically is not formed by the electric conductors 102 respectively or individually. The bulk wires of the electric conductors 102 and the lead wire 104 can come in electrical contact with each other by soldering. A copper wire which can easily be soldered to the copper wires of the electric conductors 102 and has no insulating cover is used for the lead wire 104. The ground contact 103 serves to obtain an electrical connection with the ground of an actual device when it is to be used in the actual device. It is preferable that the ground contact 103 can take the electrical connection to the ground of the actual device. The method includes a mechanical connecting method and a soldering method, and it is preferable that a structure corresponding to the method should be taken. In the fourth embodiment, a method of obtaining an electrical contact with a ground through soldering is selected and the structure is obtained by a metal plate which can easily be soldered. The electric conductors 102, the lead wire 4 and the ground contact 103 are bonded and fixed onto the box-shaped support member 105 constituted by a resin material, thereby forming the electromagnetic wave shield 1 according to the fifth embodiment.

With the structure according to the fifth embodiment, the wire width 106 of each of the electric conductors 102 and the average interval 107 between the electric conductors 102 were varied to fabricate the electromagnetic wave shield 101 and a change in the characteristics of the electromagnetic wave shield 1 with the wire width 106 of each of the electric conductors 102 and the average interval 107 between the electric conductors 102 was examined. While a bulk wire is used for the electric conductors 102 in the embodiment, the wire width 6 of the bulk wire implies the maximum width of the bulk wire, that is, the diameter of the bulk wire.

Next, an electromagnetic wave shielding characteristic according to the fifth embodiment was examined.

Figure 26:
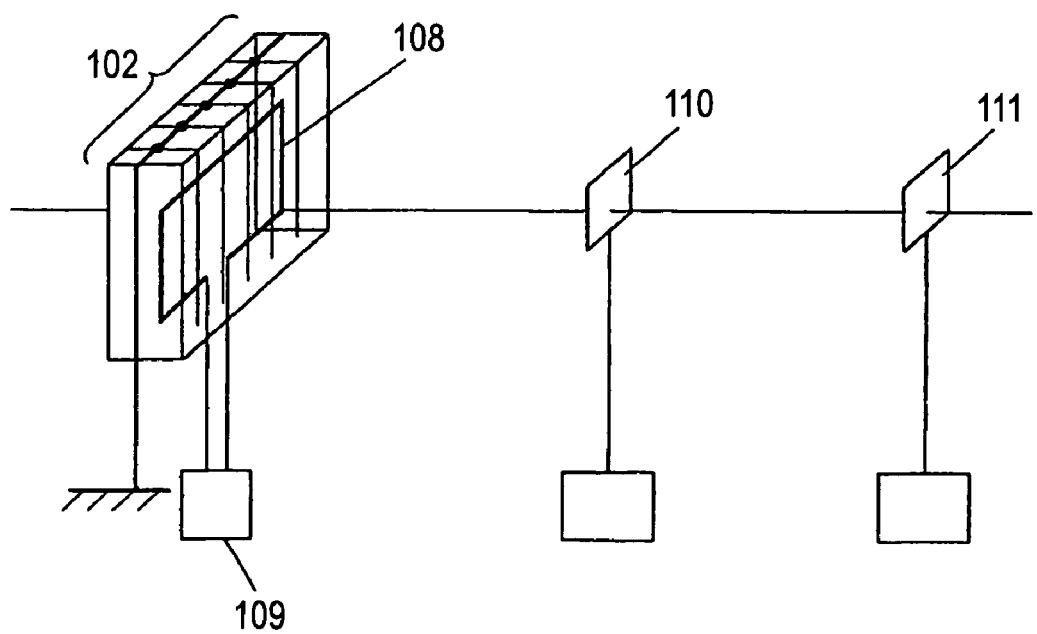
FIG. 26 is a schematic view showing the structure of an evaluation testing device according to the fifth embodiment of the invention.

An evaluation test was carried out in the following manner. FIG. 26 is a schematic view showing the structure of an evaluation testing device. The evaluation testing device is constituted by a loop antenna 108 for inducing an electromagnetic wave, a loop antenna driving power supply 9, a magnetic field intensity measuring device 110, and an electric field intensity measuring device 11 in the same manner as those in the fourth embodiment. The electromagnetic wave shield 101 to be a specimen is provided to cover the loop antenna 108. The loop antenna 108 was driven at a frequency of 10 MHz, and a magnetic field intensity and an electric field intensity were measured. When the electromagnetic wave shield 101 was to be attached to the evaluation testing device, the ground contact 103 of the electromagnetic wave shield 101 took an electrical connection to a ground in the evaluation testing device.

Figure 27:
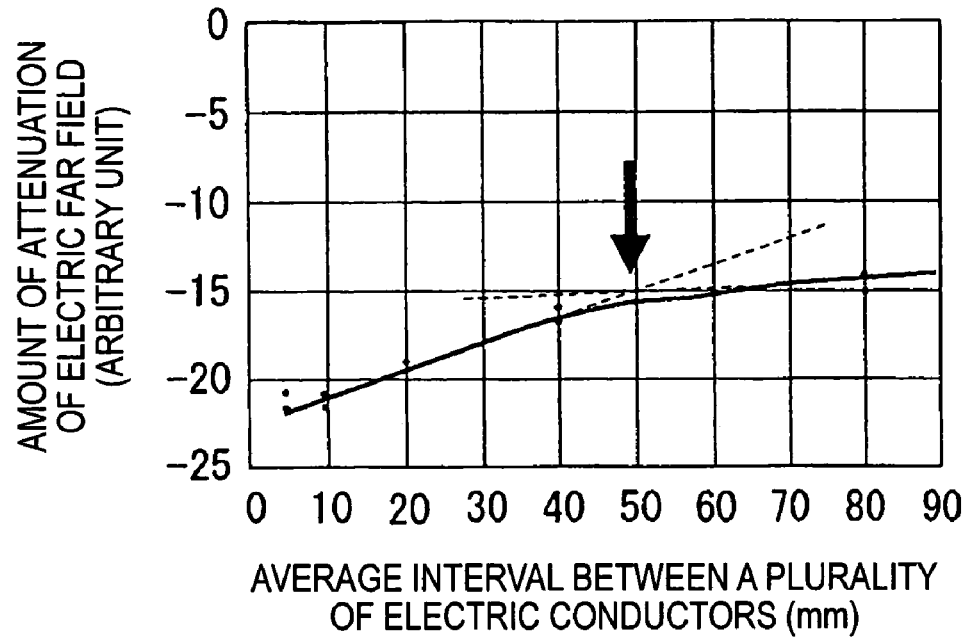
FIG. 27 is graph showing a shielding characteristic related to a electric far field according to the fifth embodiment of the invention.

FIG. 27 shows the attenuation characteristic of the electric far field intensity of the electromagnetic wave shield which is fabricated. In the fifth embodiment, it can be confirmed that the electric far field intensity can further be reduced without greatly decreasing the magnetic near field as compared with the fourth embodiment. Consequently, a planar electromagnetic field is shielded in the fourth embodiment, while the whole exciting coil 108 is covered in the fifth embodiment. Accordingly, an electromagnetic wave component to be radiated with a turn around the planar electromagnetic wave shield 101 is covered so that the electric far field intensity can further be reduced as compared with that in the fourth embodiment.

It is apparent from FIG. 27 that the amount of the attenuation of the electric far field intensity is more increased when the average interval 107 between the electric conductors 102 is reduced. More specifically, it is apparent that the average interval 107 between the electric conductors 102 is preferably reduced in order to attenuate the electric far field intensity. Moreover, it is apparent that the amount of the attenuation of the electric far field intensity and the average interval 107 between the electric conductors 402 have such a relationship that an inflection point is present in the proximity of a place in which the average interval between the electric conductors 102 is 50 mm. More specifically, if the average interval 107 between the electric conductors 102 is greater than approximately 50 mm, the change in the amount of the attenuation of the electric field intensity is reduced. It is required that the electric far field intensity is attenuated. Accordingly, it is apparent that the average interval 107 between the electric conductors 102 to effectively take the attenuation of the electric far field intensity greatly should be set to be equal to or smaller than approximately 50 mm.

Figure 28:
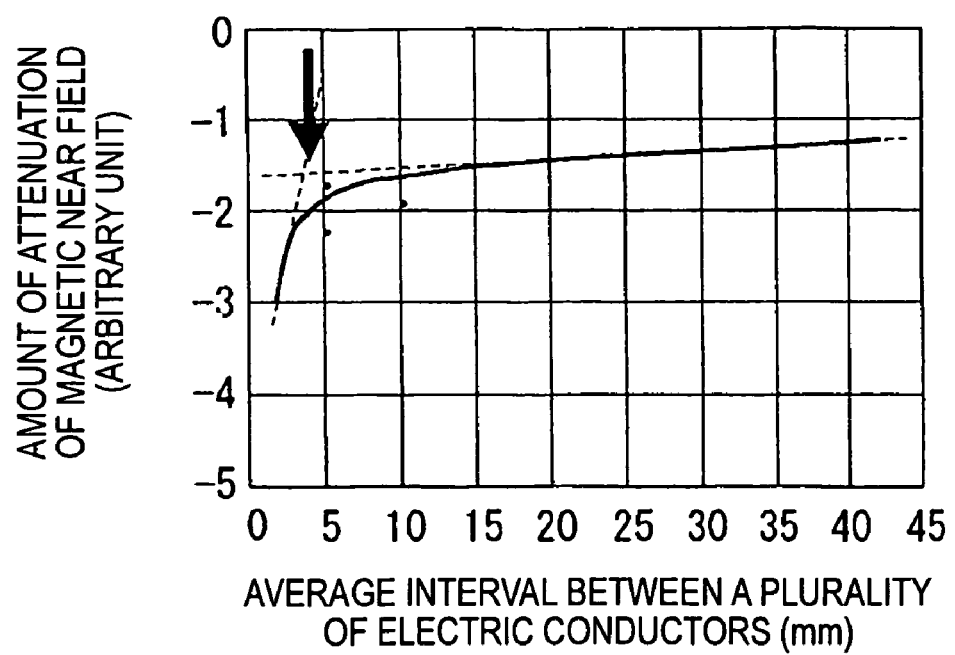
FIG. 28 is graph showing a shielding characteristic related to a magnetic near field according to the fifth embodiment of the invention.

Moreover, FIG. 28 shows the attenuation characteristic of the magnetic near field intensity of the electromagnetic wave shield 101. It is apparent that the magnetic near field intensity is stable in a region in which the average interval 107 between the electric conductors 102 is great and the amount of the attenuation of the magnetic near field intensity is gradually increased when the average interval 107 between the electric conductors 102 is smaller than approximately 10 mm. It is indicated that the amount of the attenuation of the magnetic near field intensity is suddenly increased when the average interval 107 between the electric conductors 102 is approximately 3 mm. For a characteristic, it is required that the attenuation of the magnetic near field intensity is as small as possible. Accordingly, it is apparent that the average interval 107 between the electric conductors 102 should be set to be equal to or greater than approximately 4 mm in order to maintain the amount of the attenuation of the magnetic near field intensity to be small.

Figure 29:
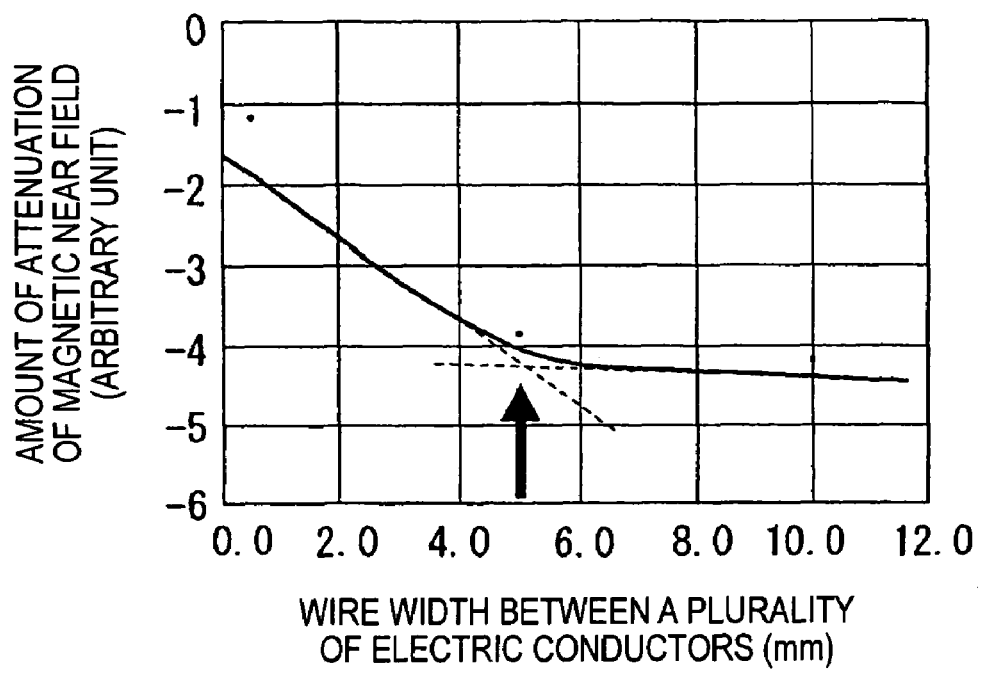
FIG. 29 is graph showing a shielding characteristic related to the magnetic near field according to the fifth embodiment of the invention.
Figure 30:
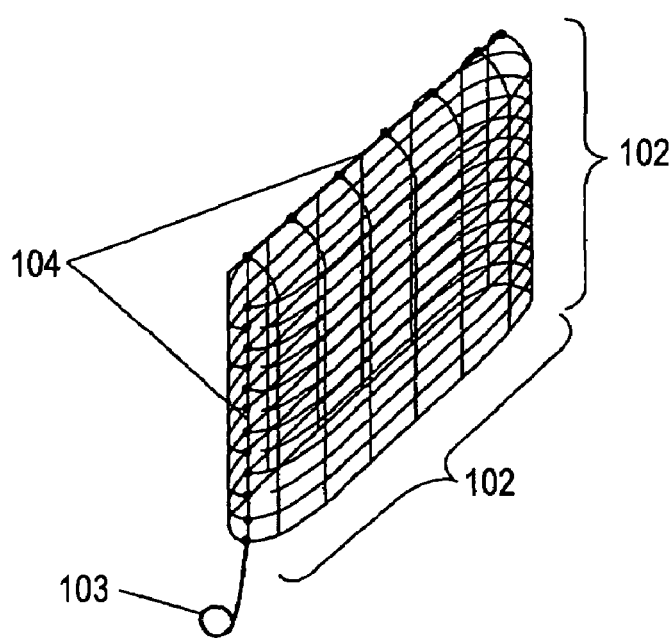
FIG. 30 is a schematic perspective view showing another configuration of the electromagnetic wave shield according to the fifth embodiment of the invention.

Moreover, FIG. 29 shows a computer simulation result for a change in the magnetic near field intensity with a variation in the wire width 106 of each of the electric conductors 102. It is apparent that the magnetic near field intensity is increased when the wire width 106 of each of the electric conductors 102 is reduced. To the contrary, it is apparent that the magnetic near field intensity is decreased when the wire width 106 of each of the electric conductors 102 is increased. For the electromagnetic wave shield 101, it is required that the attenuation of the magnetic near field intensity is reduced. It is apparent from FIG. 29 that a change in the magnetic near field intensity is reduced with respect to the wire width 106 of each of the electric conductors 102 when the wire width 106 of each of the electric conductors 102 is equal to or greater than approximately 5 mm. Accordingly, it is apparent that the wire width 106 of each of the electric conductors 102 is to be present in a smaller region than approximately 5 mm in order to, reduce the attenuation of the magnetic near field intensity. The wire width 106 of each of the electric conductors 102 is obtained as seen in the direction of the normal of the electromagnetic wave shield 1. For example, if the electric conductor is a cylindrical wire, the wire width 106 is equivalent to a diameter thereof.

From this result, it is preferable that the wire width 106 of each of the electric conductors 102 of the electromagnetic wave shield 101 should be smaller in order to transmit the magnetic near field intensity with a reduction in the attenuation of the magnetic near field intensity. However, in the case in which the wire width 106 in a bulk wire is gradually decreased, for example, it is hard to handle the bulk wire, for example, the bulk wire is apt to be cut. In consideration of this respect, it is desirable that the wire width 106 of each of the electric conductors 102 should be greater than approximately 0.05 mm. If a litz wire to be the aggregate of thin wires is previously used when the wire width 106 is small, it is easy to handle the wire in the fabrication of the electromagnetic wave shield 101 while holding the characteristic of the thin wire, that is, such a characteristic as to efficiently transmit the magnetic near field intensity. Consequently, this is effective for enhancing a productivity.

As described above, conditions to meet the range of the wire width 106 of each of the electric conductors 102 to be satisfied by the electric conductors 102 and the range of the average interval 107 between the electric conductors 102 is clear in the electromagnetic wave shield 101 for transmitting a magnetic near field and shielding a electric far field. More specifically, it is preferable that the electric conductors 102 in the electromagnetic wave shield 101 for transmitting the magnetic near field and shielding the electric far field should have the wire width 106 of approximately 0.05 mm to 5 mm and the average interval 107 of 4 mm to 50 mm.

For the following reasons, there is used the average interval 107 obtained by dividing the length of a side on which the electric conductors and the outer periphery of the region provided with the electric conductors cross each other by the number of points on which the electric conductors and the outer periphery of the region provided with the electric conductors cross each other.

More specifically, it is found that the arrangement of the electric conductors 102 exhibits a shielding characteristic having few drawbacks even if the adjacent electric conductors 102 to each other are not provided in parallel. In the case in which the electric conductors 102 are to be provided on a surface to be shielded, it is preferable that the electric conductors 102 should be provided within the range of the average interval 107 used therein as long as they are provided without an extreme deviation.

For example, in the case in which the wire width 106 of each of the electric conductors 102 is set to be equal to or smaller than approximately 0.05 mm, any problem does not arise over the transmitting property of the magnetic near field. However, the electric conductor 102 is broken very easily. For this reason, the electric conductor 102 is hard to handle and a drawback is generated in a mass production. When the electric conductors 102 to be used have the wire width 106 which is greater than approximately 5 mm, moreover, they are coupled to the magnetic near field so that the transmitting property of the magnetic near field in the electromagnetic wave shield 101 is deteriorated. If the electric conductors 102 have the wire width 6 of approximately 5 mm or more, furthermore, the electric conductors 102 themselves are easily coupled to the magnetic near field even if the average interval 107 between the electric conductors 102 is changed. For this reason, it is hard to enhance the transmitting property of the magnetic near field.

Moreover, in the case in which the average interval 107 between the electric conductors 102 is smaller than approximately 4 mm, for example, the coupling of the electric conductors 102 and the magnetic near field is so increased as to have an effect and the transmitting property of the magnetic near field of the electromagnetic wave shield 101 is deteriorated. For example, in the case in which the average interval 107 between the electric conductors 102 is set to be greater than approximately 50 mm, furthermore, the transmitting property of the electric far field is increased so that the shielding property of the electric far field to be originally shielded is deteriorated.

In a summary, in such an electromagnetic wave shield 101 as to shield the electric far field and to transmit the magnetic near field, a path following the electric conductor 102 from an optional point on the electric conductor 102 to the ground contact 103 is uniquely determined or the electric conductors 102 are coupled to the ground contact 103 so as not to form a closed loop in each of the electric conductors 102. The electromagnetic wave shield 101 is formed like a bag and the wire width of the electric conductors is to range from 0.05 mm to 5 mm, and the average interval between the electric conductors obtained by dividing the length of a side on which the electric conductors' and the outer periphery of the region provided with the electric conductors cross each other by the number of points on which the electric conductors and the outer periphery of the region provided with the electric conductors cross each other is to range from 4 mm to 50 mm. These conditions correspond to each surface of the electromagnetic wave shield formed like the bag. Moreover, this range is equivalent to the range described in the fourth embodiment.

(Table 4) shows a result obtained by fabricating an electromagnetic wave shield having an average interval of 10 mm between electric conductors formed by a litz wire having a wire diameter of 0.08 mm and 30 cores based on the conditions which are obtained, setting the electromagnetic wave shield into an actual communicating machine including a 250 mm×500 mm loop antenna, thereby examining the intensity of a magnetic near field and the amount of the attenuation of a electric far field.

TABLE 4

| | |
|---|---|
| Amount of attenuation of electric far field intensity (dB) | 22 |
| Amount of attenuation of magnetic near field intensity (dB) | 1.0 |

From the (Table 4), it can be confirmed that the electromagnetic wave shield can function to transmit the magnetic near field and to shield the electric far field also in the actual communicating machine.

While the electric conductors 102, the ground contact 103 and the lead 6 wire 104 are provided, bonded and fixed onto the box-shaped support member 105 constituted by a resin to form the electromagnetic wave shield 1 in the fifth embodiment, a method of carrying out the fixation onto the support member 105 is not restricted to the bonding. If a binding pin capable of binding the electric conductor 102 onto the support member 105 is provided, for example, the electric conductors 102 are bound to the binding pin so that the electromagnetic wave shield 101 can be formed. In this case, there is no problem if each of the electric conductors 102 is set to have an arrangement in which a path following the electric conductor 102 from the optional point on the electric conductor 102 to the ground contact 103 is uniquely determined or an arrangement in which a closed loop connected electrically is not formed by the electric conductors 102 respectively or individually when the electric conductors 102 are seen electrically, and the wire width of each of the electric conductors ranges from 0.05 mm to 5 mm and the average interval between the electric conductors which is obtained by dividing the length of the side on which the electric conductors and the outer periphery of the region provided with the electric conductors cross each other by the number of the points on which the electric conductors and the outer periphery of the region provided with the electric conductors cross each other ranges from 4 mm to 50 mm.

While the electric conductors 102, the ground contact 103 and the lead wire 104 are provided, bonded and fixed onto the box-shaped support member 105 constituted by a resin to form the electromagnetic wave shield 101 in the fifth embodiment, furthermore, they are provided, bonded and fixed onto the box-shaped support member 105 in order to easily handle the electromagnetic wave shield 101. Referring to an influence on the characteristics of the electromagnetic wave shield, it is not necessary to always provide the box-shaped support member 105. For example, as typically shown in FIG. 31, even if the electric conductors 102 crossing vertically and transversely are braided and thus constituted, there is no problem if each of the electric conductors 102 is set to have an arrangement in which a path following the electric conductor 102 from the optional point on the electric conductor 102 to the ground contact 103 is uniquely determined or an arrangement in which a closed loop connected electrically is not formed by the electric conductors 102 respectively or individually when the electric conductors 102 are seen electrically, and the wire width of each of the electric conductors ranges from 0.05 mm to 5 mm and the average interval between the electric conductors which is obtained by dividing the length of the side on which the electric conductors and the outer periphery of the region provided with the electric conductors cross each other by the number of the points on which the electric conductors and the outer periphery of the region provided with the electric conductors cross each other ranges from 4 mm to 50 mm.

In the case in which the support member 105 is not provided, it is preferable that the lead wire 104 and the grand contact 103 should be constituted by braiding with the electric conductors 102, for example. It is sufficient that the lead wire 104 has the function of electrically coupling the electric conductors 102 to the ground contact 103. Moreover, it is sufficient that the ground of an actual device for attaching the electromagnetic wave shield 101 and the ground contact 103 of the electromagnetic wave shield 101 can be bonded electrically to each other. With such a structure, the support member 105 is not provided so that it is possible to obtain a feature that bending can easily be carried out and an electromagnetic wave generating portion can readily be covered.

While the electric conductors 102 are arranged in a vertical direction to constitute the electromagnetic wave shield 101 in the fifth embodiment, moreover, the electric conductors 102 do not need to be provided in the vertical direction. In short, it is preferable that the electric conductor 102 should be provided corresponding to the intensity of an electromagnetic wave generated from an electromagnetic wave generating portion and a desirable shielding characteristic. In that case, when the electric conductors 102 are electrically seen, there is no problem if each of the electric conductors 102 is set to have an arrangement in which a path following the electric conductor 102 from the optional point on the electric conductor 102 to the ground contact 103 is uniquely determined or an arrangement in which a closed loop connected electrically is not formed by the electric conductors 102 respectively or individually, and the wire width of each of the electric conductors ranges from 0.05 mm to 5 mm and the average interval between the electric conductors which is obtained by dividing the length of the side on which the electric conductors and the outer periphery of the region provided with the electric conductors cross each other by the number of the points on which the electric conductors and the outer periphery of the region provided with the electric conductors cross each other ranges from 4 mm to 50 mm.

While the lead wire 104 for connecting the electric conductors 102 to the ground contact 103 is provided on one of the sides of the electromagnetic wave shield 101 in the fifth embodiment, moreover, the arrangement of the lead wire 104 is not restricted thereto. For example, in the case in which the area of the electromagnetic wave shield 101 is increased and the lengths of the electric conductors 102 are increased, a potential difference is made between an end of each of the electric conductors 102 which is caused to come in electrical contact with the lead wire 104 and the other end. In some cases in which the lead wire 104 is provided in an asymmetrical position over the surface of the electromagnetic wave shield 1 as in the fourth embodiment, thus, a shielding characteristic, for example, the asymmetry of a electric far field intensity is increased. In such cases, it is preferable that the lead wire 104 of the electromagnetic wave shield 101 should be provided in an almost symmetrical position. In that case, when the electric conductors 102 are seen electrically, there is no problem if each of the electric conductors 102 is set to have an arrangement in which a path following the electric conductor 102 from the optional point on the electric conductor 102 to the ground contact 103 is uniquely determined or an arrangement in which a closed loop connected electrically is not formed by the electric conductors 102 respectively or individually; and the wire width of each of the electric conductors ranges from 0.05 mm to 5 mm and the average interval between the electric conductors which is obtained by dividing the length of the side on which the electric conductors and the outer periphery of the region provided with the electric conductors cross each other by the number of the points on which the electric conductors and the outer periphery of the region provided with the electric conductors cross each other ranges from 4 mm to 50 mm.

In the case in which the ground contact 103 is provided in a plurality of places over the electromagnetic wove shield 101, moreover, the ground contacts 103 in the places form a closed loop through an actual device to be the object of the electromagnetic wave shield 101 when the electromagnetic wave shield 101 is provided in the actual device and the ground of the actual device is connected to the ground contact 103 of the electromagnetic wave shield 101. Also in this case, an arrangement in which a path following the electric conductor 102 from the optional point on the electric conductor 102 to the ground contact 103 is uniquely determined or an arrangement in which a closed loop connected electrically is not formed by the electric conductors 102 respectively or individually is held in each of the electric conductors 102 over the electromagnetic wave shield 101 according to the invention when the electric conductors 102 are seen electrically. Consequently, the magnetic coupling of the electromagnetic wave shield 101 and a magnetic near field generated from the actual device is rarely generated. In the case in which the ground contacts 103 form the closed loop through the actual device, however, it is necessary to connect the ground contact 103 of the electromagnetic wave shield 101 to the ground of the actual device by taking care so as not to interlink the magnetic near field generated from the actual device with the closed loop formed by the installation.

In the electromagnetic wave shield 101 according to the invention, thus, the attenuation of the magnetic near field can be suppressed to reduce the electric far field intensity. Therefore, it is possible to easily take countermeasures against the unnecessary radiation of high frequency applying apparatuses such as a high frequency heater, a non-electrode discharge lamp and a communicating device which mainly utilize the magnetic near field for their operations, and furthermore, it is possible to effectively use the magnetic near field generated from a high frequency electromagnetic wave generator. In addition, since the electromagnetic wave shield 101 takes the shape of a box in the fifth embodiment, it is sufficient that the source for generating an electromagnetic field is put therein and an installation can be thus carried out easily.

The electromagnetic wave shield according to the invention has the effect of reducing the magnetic coupling of the magnetic near field of an electromagnetic wave discharged from a high frequency electromagnetic wave generator and the electromagnetic wave shield and attenuating the electric far field while suppressing the attenuation of the magnetic near field, and is mainly useful for countermeasures against the unnecessary radiation of high frequency applying apparatuses such as a high frequency heater, a non-electrode discharge lamp and a communicating device which mainly utilize the magnetic near field for their operations (Sixth Embodiment)

Figure 31:
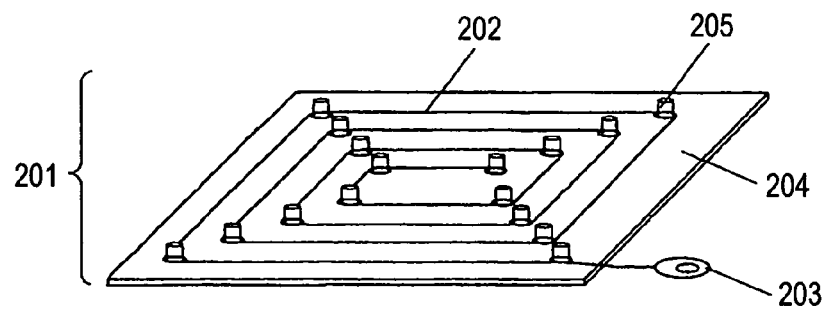
FIG. 31 is a perspective view showing an electromagnetic wave shield according to a sixth embodiment of the invention.

FIG. 31 is a perspective view showing an electromagnetic wave shield according to a Sixth embodiment of the invention. As shown in FIG. 31, an electromagnetic wave shield 201 according to the sixth embodiment is constituted by an electric conductor 2, a ground contact 3 and a support member 204. The support member 204 further has an electric conductor support member 205 for positioning and fixing the electric conductor 2.

The electric conductor 2 is wound around the electric conductor support member 205. The electric conductor 2 has one of ends opened and the other end to which the ground contact 3 is electrically connected. More specifically, this indicates that a path from an optional point on the electric conductor 202 to the ground contact 3 along the electric conductor 202 is uniquely determined when the electric conductor 202 is electrically seen. In other words, it implies that the electric conductor 202 does not form a closed loop connected electrically. In the sixth embodiment, a litz wire including 30 cores having a wire diameter of 0.08 mm is used for the electric conductor 202. Moreover, the ground contact 3 serves to obtain an electrical connection with the ground of an actual device when the electro magnetic wave shield 201 is used in the actual device. It is preferable that the ground contact 203 should be electrically connected to the ground of the actual device. The method includes a mechanical connecting method through screwing and a soldering method, and it is preferable that the structure should correspond to the method. In the sixth embodiment, the mechanical connecting method is selected and a metal plate capable of carrying out the screwing is used for a structure. The connection of the electric conductor 202 and the ground contact 203 is carried out through the soldering.

In the electromagnetic wave shield 201, thus, the electric conductor 202 is loop-shaped (spiral), and the electric conductor 202 has one of ends opened to be an open end, and the other end to be the ground contact 203 which is to be connected to a ground.

Moreover, the support member 204 supports and constitutes the electric conductor 202 wound upon the electric conductor support member 205 and is formed by an insulating material. In the sixth embodiment, the support member 204 is constituted by a resin plate. While the electric conductor support member 205 is also formed by an insulating material, moreover, it is formed integrally with the support member 204 in the sixth embodiment.

Figure 32:
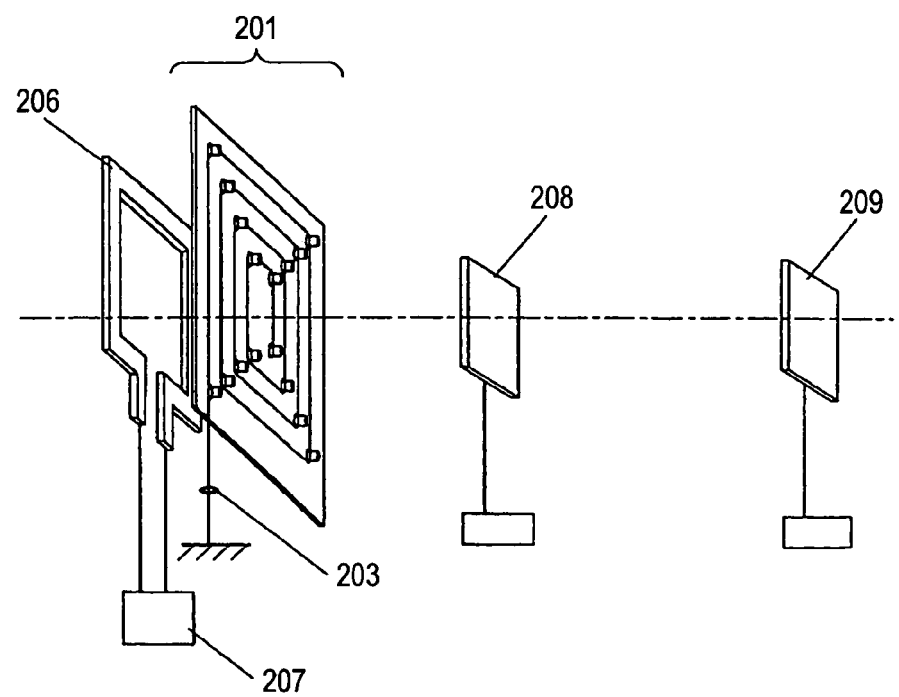
FIG. 32 is a schematic view showing the structure of an evaluation testing device.

Next, the shielding characteristic of the electromagnetic wave shield 201 according to the sixth embodiment was examined. An evaluation test was carried out in the following manner. FIG. 32 is a schematic view showing the structure of an evaluation testing device. The evaluation testing device is constituted by a loop antenna 206 for inducing an electromagnetic wave, a loop antenna driving power supply 207, a magnetic field intensity measuring device 208 and an electric field intensity measuring device 209. The electromagnetic field shield 201 to be a test member is provided in a predetermined position between the loop antenna 206 and the magnetic field intensity measuring device 208. The loop antenna 206 is driven at a frequency of 10 MHz to measure a magnetic field intensity and an electric field intensity. When the electromagnetic wave shield 201 is to be attached to the evaluation testing device, the ground contact 203 of the electromagnetic wave shield 201 takes an electrical connection to the ground of the evaluation testing device.

According to the evaluation, in the case in which the electromagnetic wave shield according to the sixth embodiment is used, a electric far field can be attenuated by approximately 10 dB as compared with the case in which the same electromagnetic wave shield is not used. At this time, the attenuation of a magnetic near field can be reduced to approximately 0.3 dB.

In the sixth embodiment, the electric conductor 202 has the structure in which the path from the optional point on the electric conductor 202 to the ground contact 203 along the electric conductor 202 is uniquely determined as seen electrically or the structure in which the electric conductor 202 does not form the closed loop. Consequently, the magnetic coupling of the magnetic near field discharged from the loop antenna 206 and the electromagnetic wave shield 201 can be suppressed so that the attenuation of the magnetic near field can be reduced. Moreover, the electric far field can be attenuated by setting the electric conductor 202 to have a ground potential through the ground contact 203.

In the sixth embodiment, there has been used, for the electric conductor 202, the litz wire to be the aggregate of thin wires having an insulating cover. Consequently, the coupling of a magnetic field radiated from an electromagnetic wave generator and the electric conductor 202 to be the structure of the electromagnetic wave shield 201 is suppressed to reduce a loss caused by the electromagnetic wave shield 201 and to aggregate the thin wires, thereby controlling an increase in an electric resistance as compared with the case of a solid thin wire and thus maintaining the shielding property of an electric field. Since the litz wire is the aggregate of the thin wires, moreover, it can easily be fabricated because the electric conductor 202 has a high mechanical strength and can easily be wound around. However, the electric conductor 202 is not restricted to the litz wire but it is preferable that the electric conductor 202 should be selected depending on the frequency of an electromagnetic wave to be an object and the size of a shielding surface, and a solid wire may be used. While the electric conductor 202 is a litz wire having a surface insulated and covered, moreover, the insulation covering for the electric conductor 202 is not always required when a solid wire is used for the electric conductor 202. In the case in which the insulation covering is not carried out, a condition that the electric conductor 202 does not constitute the closed loop which is to be taken by the electric conductor 202 is not satisfied when the electric conductors 202 come in contact with each other so that there is a problem in that the attenuation of a shield performance, particularly, a magnetic field is increased. In particular, it is necessary to take care when an interval between the electric conductors 202 is reduced. Furthermore, it is necessary to take care of the electrical contact of the electromagnetic wave shield 201 and the electromagnetic wave generator.

While the electric conductor support member 205 is used as a supporting point when the electric conductor 202 is to be wound around in the sixth embodiment, moreover, it is preferable, that the electric conductor 202 should be constituted to be wound around. For example, the electric conductor 202 may be fixed onto the support member 204 with an adhesive.

While the electric conductor 202 is connected to the ground contact 203 by using one of the ends of the electric conductor 202 in the sixth embodiment, moreover, the electric conductor 202 is not always connected to the ground contact 203 at one of the ends of the electric conductor 202 but may be connected to the ground contact 203 at an optional point on the electric conductor 202. In that case, as seen electrically, it is necessary to take care in order for the electric conductor 202 to have the structure in which a path from the optional point on the electric conductor 202 to the ground contact 203 along the electric conductor 202 is uniquely determined or the structure in which the electric conductor 202 does not form the closed loop.

Figure 33:
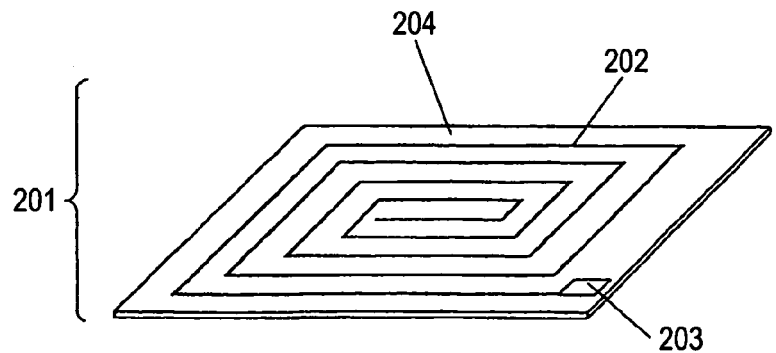
FIG. 33 is a perspective view showing an electromagnetic wave shield according to another example of the sixth embodiment of the invention.

While a bulk wire is used for the electric conductor 202 in the sixth embodiment, moreover, the electric conductor 202 is not restricted to the bulk wire but it is also possible to form a wiring pattern having a structure in which the copper foil of a printed circuit board 210 is subjected to etching and the same electric conductor 202 as that in the sixth embodiment is wound around as shown in FIG. 33, for example. In that case, as seen electrically, it is necessary to take care in order for the electric conductor 202 to have the structure in which the path from the optional point on the electric conductor 202 to the ground contact 203 along the electric conductor 202 is uniquely determined or the structure in which the electric conductor 202 does not form the closed loop. FIG. 33 is a perspective view showing an electromagnetic wave shield according to another example of the sixth embodiment of the invention.

In the sixth embodiment, thus, an electromagnetic wave shield capable of suppressing the attenuation of a magnetic near field and attenuating a electric far field can be implemented with a structure in which the electric conductor 202 is wound upon the support member 204 and one of the ends thereof is connected to the ground through the ground contact 203. Therefore, a fabrication can easily be carried out and a productivity can also be enhanced. Consequently, it is possible to easily take countermeasures against the unnecessary radiation of high frequency applying apparatuses such as a high frequency heater, a non-electrode discharge lamp and a communicating device which mainly utilize the magnetic near field for their operations, and furthermore, it is possible to effectively use the magnetic near field radiated at the same time.

(Seventh Embodiment)

Figure 34:
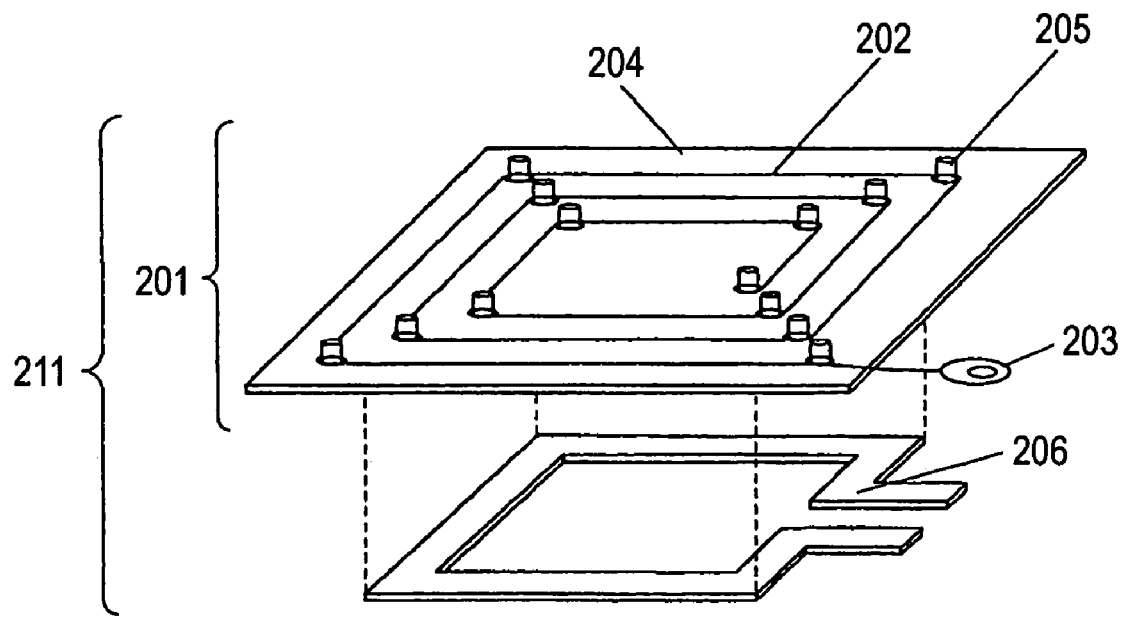
FIG. 34(a) is a perspective view showing a loop antenna apparatus according to a seventh embodiment of the invention and FIG. 34(b) is a top view showing the loop antenna apparatus according to the seventh embodiment of the invention.
Figure 34:
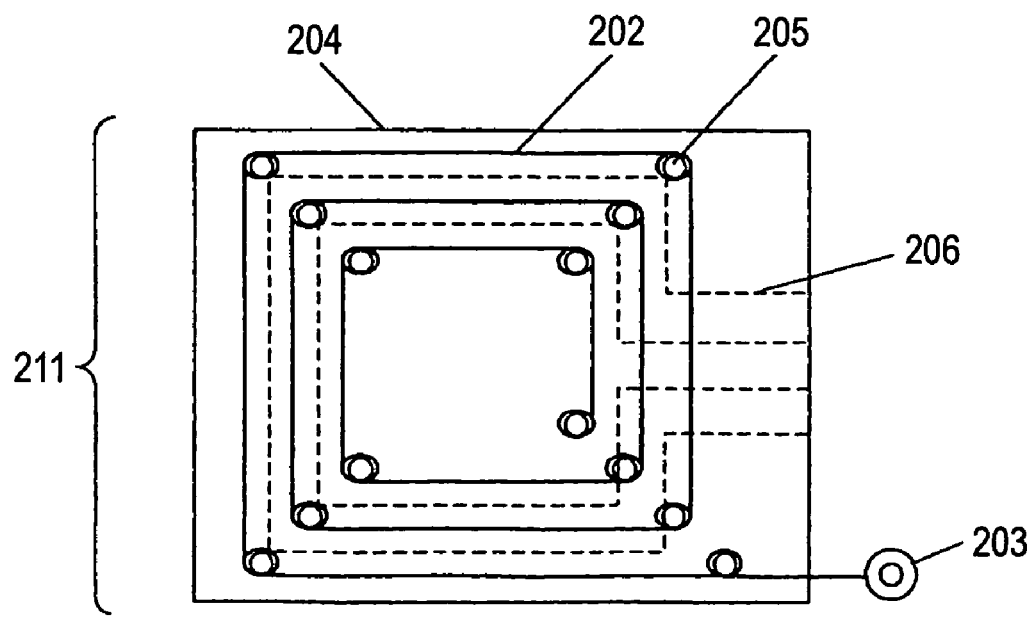

FIGS. 4(a) and 4(b) are perspective and top views showing a loop antenna apparatus according to a seventh embodiment of the invention. A loop antenna apparatus 211 is constituted by an electromagnetic wave shield 201, a loop antenna 206, and a housing and an electric circuit for receiving a signal from the loop antenna 206 which are not shown. The electromagnetic wave shield 201 having the same structure as that of the sixth embodiment is used. The electromagnetic wave shield 201 according to the sixth embodiment is formed by winding an electric conductor 202 upon a support member 204. The electromagnetic wave shield 201 of the loop antenna apparatus 211 according to the seventh embodiment is constituted by winding the electric conductor 202 to take a shape conforming to the loop antenna 206 as shown in FIG. 34(b).

The electromagnetic wave shield 201 of the loop antenna apparatus 211 according to the seventh embodiment has such a structure that the electric conductor 202 is electrically connected to a ground through a ground contact 203 and a path from the optional point of the electric conductor 202 to the ground contact 203 is provided to be uniquely determined, and the electric conductor 202 is wound around, and can shield an electric field and can transmit a magnetic field. Moreover, the electric conductor 202 is wound around to take the shape conforming to the loop antenna 206, thereby constituting the electromagnetic wave shield 201. Therefore, the ground is present along the vicinity of the loop antenna 206. Accordingly, the electric field can be shielded efficiently.

The unnecessary radiation characteristic of the loop antenna apparatus 211 according to the seventh embodiment was examined in the same manner as that in the sixth embodiment. The loop antenna apparatus 211 according to the seventh embodiment having the electromagnetic wave shield 201 can attenuate a electric far field by approximately 209 dB as compared with an antenna apparatus in which the electromagnetic wave shield 201 is not provided. At this time, the attenuation of a magnetic near field can be reduced down to approximately 0.5 dB.

While the electromagnetic wave shield 201 fabricated by winding a bulk wire around has been used in the loop antenna apparatus 211 according to the seventh embodiment, the electromagnetic wave shield 201 is not restricted to the bulk wire but may be fabricated by a printed circuit board.

While the electromagnetic wave shield 201 of the loop antenna apparatus 211 according to the seventh embodiment is constituted by winding the electric conductor 202 over the front surface of the support member 204, moreover, it is preferable to determine a way of winding the electric conductor 202 around while seeing the shielding characteristic, particularly, the shielding characteristic of an electric field.

Thus, the loop antenna apparatus 211 according to the seventh embodiment has such a characteristic that a electric far field can be attenuated without the attenuation of a magnetic near field. Therefore, the loop antenna apparatus 211 can be utilized for an automatic recognizing apparatus using a high frequency which utilizes a magnetic near field as communicating means, for example. In particular, the loop antenna apparatus 211 is effective for regulating an unnecessary radiation to an electric field. It is not necessary to adjust an input to the loop antenna 206 in order to satisfy the unnecessary radiation regulation. Thus, it is possible to increase the input to the loop antenna 206, thereby lengthening a communication distance.

(Eighth Embodiment)

Figure 35:
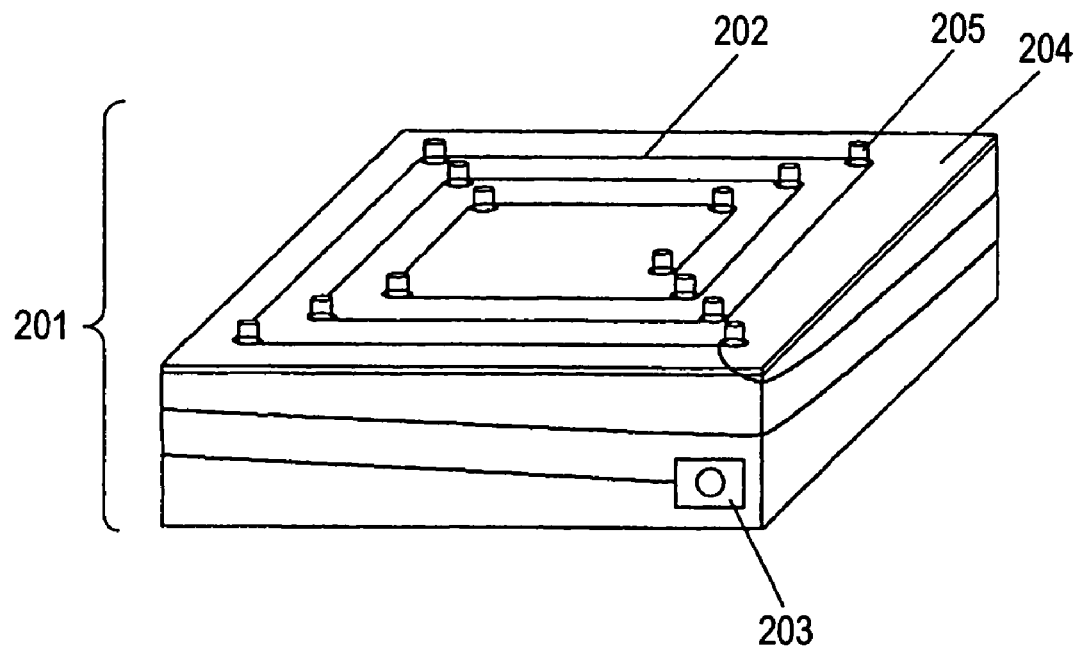
FIG. 35 is a perspective view showing an electromagnetic wave shield according to a eighth embodiment of the invention.

FIG. 35 is a perspective view showing an electromagnetic wave shield according to a eighth embodiment of the invention.

As shown in FIG. 35, the electromagnetic wave shield according to the eighth embodiment is constituted by an electric conductor 202, a ground contact 203 and a support member 204.

The support member 204 further has an electric conductor support member 205 for positioning and fixing the electric conductor 204. The support member 204 is formed by an electrical insulating resin and takes the shape of a box, and the electric conductor support member 205 for positioning the electric conductor 202 is provided on one surface of the support member 204.

The electric conductor 202 is constituted to be wound around the electric conductor support member 205, and furthermore, to be wound around the whole support member 204 taking the shape of a box.

The electric conductor 202 has one of ends opened and the other end to which the ground contact 203 is electrically connected. More specifically, this indicates that a path from an optional point on the electric conductor 202 to the ground contact 203 along the electric conductor 202 is uniquely determined when the electric conductor 202 is electrically seen. In other words, it implies that the electric conductor 202 does not form a closed loop connected electrically.

In the sixth embodiment, a litz wire including 30 cores having a wire diameter of 0.08 mm is used for the electric conductor 202.

The ground contact 203 serves to obtain an electrical connection with the ground of an actual device when the electromagnetic wave shield 201 is used in the actual device. It is preferable that the ground contact 203 should be electrically connected to the ground of the actual device. The method includes a mechanical connecting method through screwing and a soldering method, and it is preferable that the structure should correspond to the method. In the eighth embodiment, the mechanical connecting method is selected and a metal plate capable of carrying out the screwing is used for a structure. The connection of the electric conductor 202 and the ground contact 203 is carried out through the soldering.

Moreover, the support member 204 supports and constitutes the electric conductor 202 wound upon the electric conductor support member 205 and is formed by an electrical insulating resin. While the electric conductor support member 205 is also formed by an insulating material, furthermore, it is formed integrally with the support member 204 in the sixth embodiment.

Next, the electromagnetic wave shielding characteristic of the electromagnetic wave shield 201 according to the eighth embodiment was examined in the same manner as that in the sixth embodiment. When the electromagnetic wave shield 201 is to be attached to the evaluation testing device, the ground contact 203 of the electromagnetic wave shield 201 takes an electrical connection to the ground of the evaluation testing device.

According to the evaluation, in the case in which the electromagnetic wave shield 201 is used, a electric far field can be attenuated by approximately 211 dB as compared with the case in which the same electromagnetic wave shield 201 is not used. At this time, the attenuation of a magnetic near field can be reduced to approximately 0.5 dB.

In the eighth embodiment, as seen electrically, the electric conductor 202 has the structure in which the path from the optional point on the electric conductor 202 to the ground contact 203 along the electric conductor 202 is uniquely determined or the structure in which the electric conductor 202 does not form the closed loop. Consequently, the magnetic coupling of the magnetic near field discharged from the loop antenna 206 and the electromagnetic wave shield 201 can be suppressed so that the attenuation of the magnetic near field can be reduced. Moreover, the electric far field can be attenuated by setting the electric conductor 202 to have a ground potential through the ground contact 203.

In the eighth embodiment, there has been used, for the electric conductor 202, the litz wire to be the aggregate of thin wires having an insulating cover. Consequently, the coupling of a magnetic field radiated from an electromagnetic wave generator and the electric conductor 202 to be the structure of the electromagnetic wave shield 201 is suppressed to reduce a loss caused by the electromagnetic wave shield 201 and to aggregate the thin wires, thereby controlling an increase in an electric resistance as compared with the case of a solid thin wire and thus maintaining the shielding property of an electric field. Since the litz wire is the aggregate of the thin wires, moreover, it can easily be fabricated because the electric conductor 202 has a high mechanical strength and can easily be wound around. However, the electric conductor 202 is not restricted to the litz wire but it is preferable that the electric conductor 202 should be selected depending on the frequency of an electromagnetic wave to be an object and the size of a shielding surface, and a solid wire may be used. While the electric conductor 202 is a litz wire having a surface insulated and covered, moreover, the insulation covering for the electric conductor 202 is not always required when a solid wire is used for the electric conductor 202. In the case in which the insulation covering is not carried out, a condition that the electric conductor 202 does not constitute the closed loop which is to be taken by the electric conductor 202 is not satisfied when the electric conductors 202 come in contact with each other so that there is a problem in that the attenuation of a shield performance, particularly, a magnetic field is increased. In particular, it is necessary to take care when an interval between the electric conductors 202 is reduced. Furthermore, it is necessary to take care of the electrical contact of the electromagnetic wave shield 201 and the electromagnetic wave generator.

While the electric conductor support member 205 is used as a supporting point when the electric conductor 202 is to be wound around in the eighth embodiment, moreover, it is preferable that the electric conductor 202 should be constituted to be wound around. For example, the electric conductor 202 may be fixed onto the support member 204 with an adhesive.

While the electric conductor 202 is connected to the ground contact 203 by using one of the ends of the electric conductor 202 in the eighth embodiment, moreover, the electric conductor 202 is not always connected to the ground contact 203 at one of the ends of the electric conductor 202 but may be connected to the ground contact 203 at an optional point on the electric conductor 202. In that case, as seen electrically, it is necessary to take care in order for the electric conductor 202 to have the structure in which a path from the optional point on the electric conductor 202 to the ground contact 203 along the electric conductor 202 is uniquely determined or the structure in which the electric conductor 202 does not form the closed loop.

While a bulk wire is used for the electric conductor 202 in the eighth embodiment, the electric conductor 202 is not restricted to the bulk wire but it is also possible to form a wiring pattern having a structure in which the copper foil of a printed circuit board 210 is subjected to etching and the same electric conductor 202 as that in the eighth embodiment is wound around, for example. In that case, as seen electrically, it is necessary to take care in order for the electric conductor 202 to have the structure in which the path from the optional point on the electric conductor 202 to the ground contact 203 along the electric conductor 202 is uniquely determined or the structure in which the electric conductor 202 does not form the closed loop.

In the eighth embodiment, thus, an electromagnetic wave shield capable of suppressing the attenuation of a magnetic near field and attenuating a electric far field can easily be fabricated. Therefore, it is possible to easily take countermeasures against the unnecessary radiation of high frequency applying apparatuses such as a high frequency heater, a non-electrode discharge lamp and a communicating device which mainly utilize the magnetic near field for their operations, and furthermore, it is possible to effectively use the magnetic near field radiated at the same time.

Moreover, the electromagnetic wave shield 201 according to the eighth embodiment is constituted by winding the electric conductor 202 around the support member 204 taking the shape of a box. Therefore, it is sufficient that an electromagnetic wave generator to be a shielding object is put in the box of the electromagnetic wave shield 201. Consequently, the attachment property of the electromagnetic wave shield 201 can be enhanced.

(Ninth Embodiment)

Figure 36:
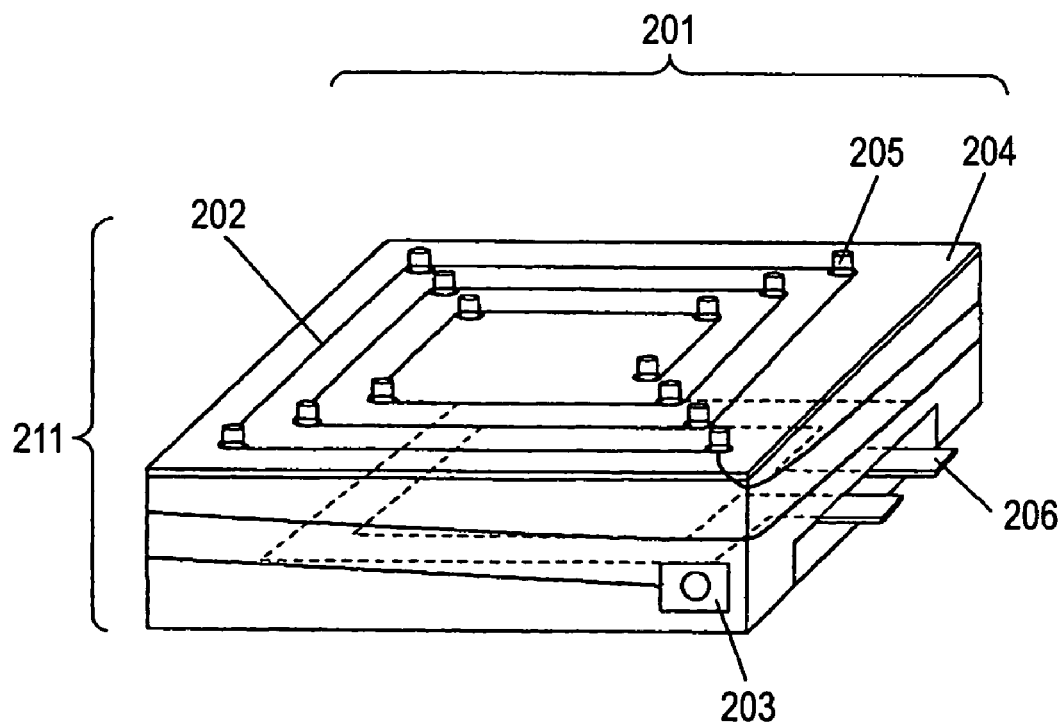
FIG. 36 is a perspective view showing a loop antenna apparatus according to a ninth embodiment of the invention.

FIG. 36 is a perspective view showing a loop antenna apparatus according to a ninth embodiment of the invention. A loop antenna apparatus 211 is constituted by an electromagnetic wave shield 201, a loop antenna 206, and an electric circuit for receiving a signal from the loop antenna 206 which is not shown. The electromagnetic wave shield 201 having the same structure as that used in the eighth embodiment and taking the shape of a box is used.

The electromagnetic wave shield 201 of the loop antenna apparatus 211 according to the ninth embodiment is formed by winding an electric conductor 202 upon a support member 204. The electromagnetic wave shield 201 of the loop antenna apparatus 211 according to the ninth embodiment is constituted by winding the electric conductor 202 to take a shape conforming to the loop antenna 206.

The electromagnetic wave shield 201 of the loop antenna apparatus 211 according to the ninth embodiment has such a structure that the electric conductor 202 is electrically connected to a ground through a ground contact 203 and a path from the optional point of the electric conductor 202 to the ground contact 203 is provided to be uniquely determined, and the electric conductor 202 is wound around, and can shield an electric field and can transmit a magnetic field. Moreover, the electric conductor 202 is wound around to take the shape conforming to the loop antenna 206, thereby constituting the electromagnetic wave shield 201. Therefore, the ground is present along the vicinity of the loop antenna 206. Accordingly, the electric field can be shielded efficiently.

The unnecessary radiation characteristic of the loop antenna apparatus 211 according to the ninth embodiment was examined in the same manner as that in the sixth embodiment. The loop antenna apparatus 211 according to the ninth embodiment having the electromagnetic wave shield 201 can attenuate a electric far field by approximately 12 dB as compared with an antenna apparatus in which the electromagnetic wave shield 201 is not provided. At this time, the attenuation of a magnetic near field can be reduced down to approximately 0.3 dB.

While the electromagnetic wave shield 201 fabricated by winding a bulk wire has been used in the ninth embodiment, the electromagnetic wave shield 201 is not restricted to the bulk wire but may be fabricated by a printed circuit board.

While the electromagnetic wave shield 201 is constituted by winding the electric conductor 202 over the front surface of the support member 204 in the loop antenna apparatus 211 according to the ninth embodiment, moreover, it is preferable to determine a way of winding the electric conductor 202 while seeing the shielding characteristic, particularly, the shielding characteristic of an electric field.

Figure 37:
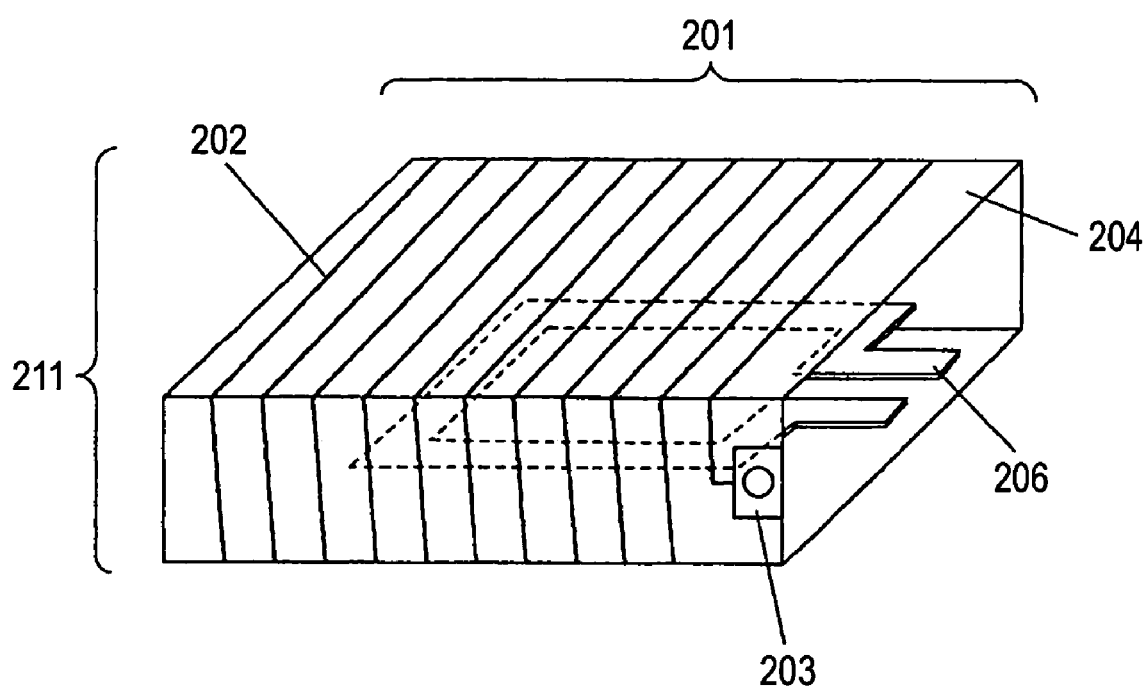
FIG. 37 is a perspective view showing a loop antenna apparatus according to another example of the ninth embodiment of the invention.

While the direction for winding the electric conductor in the electromagnetic wave shield is set to be the same as the direction for winding a loop antenna in the ninth embodiment, moreover, the direction for winding the electric conductor is not restricted thereto but a structure shown in FIG. 37 may be employed, for example. FIG. 37 is a perspective view showing another loop antenna apparatus according to the ninth embodiment of the invention.

Thus, the loop antenna apparatus 211 according to the ninth embodiment has such a characteristic that a electric far field can be attenuated without the attenuation of a magnetic near field. Therefore, the loop antenna apparatus 211 can be utilized for an automatic recognizing apparatus using a high frequency which utilizes a magnetic near field as communicating means, for example. In particular, the loop antenna apparatus 211 is effective for regulating an unnecessary radiation to an electric field. It is not necessary to adjust an input to the loop antenna 206 in order to satisfy the unnecessary radiation regulation. Thus, it is possible to increase the input to the loop antenna 206, thereby lengthening a communication distance.

The invention is required for an electromagnetic field generating device to attenuate a electric far field while suppressing the attenuation of a magnetic near field in an electromagnetic wave which is discharged and a loop antenna, and can also be applied to a loop antenna for supplying a power to a radio communicating medium such as a non-contact IC card and for transferring data, for example.

CROSS REFERENCE TO RELATED APPLICATION

This application is based upon and claims the benefit of priority of Japanese Patent Application No2003-182321 filed on 03/06/26 and Japanese Patent Application No2003-389129 filed on 03/11/19 and Japanese Patent Application No2004-021086 filed on 04/01/29, the contents of which are incorporated herein by references in its entirety.

What is claimed is:

1. An electromagnetic wave shield for covering an apparatus which generates a high frequency electromagnetic field including an electric field and a magnetic flux, the electromagnetic wave shield comprising:
   a plurality of electric conductors covered with an insulating material;
   a ground contact for carrying out a connection to a ground; and
   a lead wire for connecting the electric conductors to the ground contact, each of the plurality of the electric conductors being electrically connected to the ground contact through the lead wire, wherein each of the plurality of the electric conductors crosses another one of the electrical conductors without being electrically connected thereto due to the insulating material.

2. The electromagnetic wave according to claim 1 wherein said plurality of conductors are formed like a grid.

3. An electromagnetic wave shield according to claim 1 wherein each of the plurality of electric conductors has a thickness of 0.05 mm to 5 mm and a first end and a second end and each of the plurality of the electric conductors is provided in such a manner that the first end is electrically connected to the ground contact and the second end is not electrically connected to any electric element.

* * * * *